(12) United States Patent
Nagao

(10) Patent No.: US 11,973,165 B2
(45) Date of Patent: Apr. 30, 2024

(54) METHOD OF MANUFACTURING LIGHT EMITTING DEVICE

(71) Applicant: NICHIA CORPORATION, Anan (JP)

(72) Inventor: Masaki Nagao, Anan (JP)

(73) Assignee: NICHIA CORPORATION, Anan (JP)

( * ) Notice: Subject to any disclaimer, the term of this patent is extended or adjusted under 35 U.S.C. 154(b) by 485 days.

(21) Appl. No.: 17/480,043

(22) Filed: Sep. 20, 2021

(65) Prior Publication Data
US 2022/0102590 A1    Mar. 31, 2022

(30) Foreign Application Priority Data

Sep. 25, 2020   (JP) ................................ 2020-161364

(51) Int. Cl.
| H01L 33/46 | (2010.01) |
| H01L 27/15 | (2006.01) |
| H01L 33/00 | (2010.01) |
| H01L 33/58 | (2010.01) |

(52) U.S. Cl.
CPC ............ *H01L 33/46* (2013.01); *H01L 27/156* (2013.01); *H01L 33/005* (2013.01); *H01L 33/58* (2013.01); *H01L 2933/0025* (2013.01); *H01L 2933/0058* (2013.01)

(58) Field of Classification Search
CPC ....... H01L 33/46; H01L 33/005; H01L 33/58; H01L 27/156; H01L 2933/0058; H01L 2933/0025
See application file for complete search history.

(56) References Cited

U.S. PATENT DOCUMENTS

| 5,175,783 A | * | 12/1992 | Tatoh | .................... | G02B 6/4249 |
| | | | | | 257/E33.059 |
| 9,877,365 B1 | * | 1/2018 | Chung | .................... | H05B 47/19 |
| 10,066,821 B1 | * | 9/2018 | Chung | ................ | H01L 25/0753 |
| 2006/0092618 A1 | * | 5/2006 | Tanaka | .................... | H01L 33/20 |
| | | | | | 257/E33.068 |

(Continued)

FOREIGN PATENT DOCUMENTS

| JP | 2005-243739 A | 9/2005 |
| JP | 2014-127679 A | 7/2014 |

(Continued)

*Primary Examiner* — Gary F Paumen
(74) *Attorney, Agent, or Firm* — Global IP Counselors, LLP

(57) ABSTRACT

A method for manufacturing a light emitting device includes: preparing a light-shielding frame defining a through-hole, and having at least one convex portion; supplying a light reflecting resin so that the convex portion is at least partially covered; preparing a light-transmissive member having a first surface with an outer periphery smaller than an inner periphery of the first main surface, a first side surface contiguous with the first surface, a second side surface located outside of the first side surface, and a third surface contiguous with the first and second side surfaces; bringing the third surface into contact with the convex portion, or with the light reflecting resin in contact with the convex portion, so that the light reflecting resin is disposed between the first side surface and an inside surface of the light-shielding frame; curing the light reflecting resin; and joining light emitting elements and the light-transmissive member.

12 Claims, 15 Drawing Sheets

(56) References Cited

U.S. PATENT DOCUMENTS

| | | | |
|---|---|---|---|
| 2012/0268929 A1* | 10/2012 | Chung | F21V 29/503 |
| | | | 362/231 |
| 2013/0088867 A1* | 4/2013 | Chung | F21V 19/003 |
| | | | 362/238 |
| 2017/0038009 A1* | 2/2017 | Chung | F21K 9/60 |
| 2017/0122501 A1* | 5/2017 | Chung | F21V 3/02 |
| 2019/0165218 A1 | 5/2019 | Nakai et al. | |
| 2019/0302350 A1 | 10/2019 | Yamaoka et al. | |
| 2020/0096163 A1 | 3/2020 | Yamaoka | |
| 2020/0135991 A1* | 4/2020 | Lin | H01L 33/52 |

FOREIGN PATENT DOCUMENTS

| | | |
|---|---|---|
| JP | 2019-102614 A | 6/2019 |
| JP | 2019-186513 A | 10/2019 |
| JP | 2020-053504 A | 4/2020 |
| JP | 2020-188265 A | 11/2020 |

\* cited by examiner

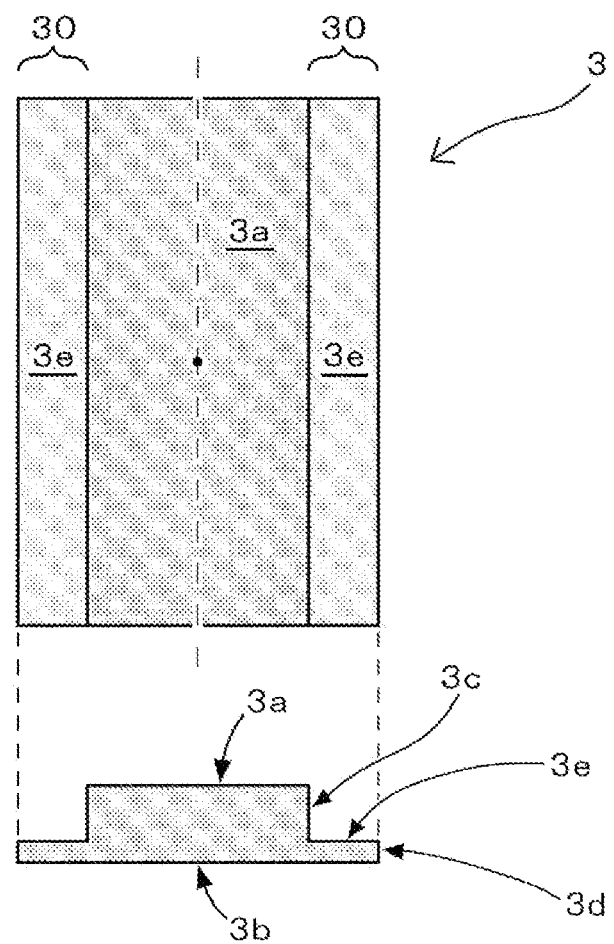

METHOD OF MANUFACTURING LIGHT EMITTING DEVICE

CROSS-REFERENCE TO RELATED PATENT APPLICATION

This application claims priority to Japanese Patent Application No. 2020-161364, filed Sep. 25, 2020. The entire disclosure of Japanese Patent Application No. 2020-161364 is hereby incorporated herein by reference.

BACKGROUND

The present disclosure relates to a method of manufacturing a light emitting device.

High-output light emitting devices in which LEDs or other such light emitting elements are used as a light source in automotive applications have conic to use in recent years. For instance, Japanese Patent Publication No. 2014-127679 discloses a high-output light emitting device that is used as an automotive light source, wherein a heat dissipating layer is formed so as to cover the peripheral edge of the light emission surface of the light emitting element to improve the heat dissipation effect.

SUMMARY

An object of the present disclosure is to provide a method of manufacturing a light emitting device in which a difference in luminance between the inside and the outside of the light exit surface is large, and light emitted from a light emitting element can be efficiently extracted.

According to an embodiment of the present disclosure, a method for manufacturing a light emitting device includes: disposing light emitting elements on a substrate; preparing a light-shielding frame having a first main surface and a second main surface on an opposite side from the first main surface, the light-shielding frame defining a through-hole extending between the first main surface and the second main surface, and the light-shielding frame having at least one convex portion on the second main surface; supplying a light reflecting resin to the second main surface of the light-shielding frame so that the light reflecting resin comes into contact with the convex portion and the convex portion is at least partially covered by the light reflecting resin; preparing a light-transmissive member having a first surface with an outer periphery that is smaller than an inner periphery of the first main surface of the light-shielding frame surrounding the through-hole in a plan view, a second surface on an opposite side from the first surface, a first side surface contiguous with the first surface, a second side surface located outside of the first side surface in the plan view, the second side surface being contiguous with the second surface, and a third surface contiguous with the first side surface and the second side surface; bringing the third surface of the light-transmissive member into contact with the convex portion of the light-shielding frame, or with the light reflecting resin that is in contact with the convex portion, while the first side surface of the light-transmissive member and an inside surface of the light-shielding frame are separated from each other, so that the light reflecting resin is disposed between the first side surface of the light-transmissive member and the inside surface of the light-shielding frame; curing the light reflecting resin to form a first light reflecting member thereby forming an optical member in which the light-shielding frame and the light-transmissive member are joined by the first light reflecting member; and joining upper surfaces of the light emitting elements and the second surface of the light-transmissive member.

According to an embodiment of the present disclosure, it is possible to manufacture, a light emitting device in which disclosure a difference in luminance between the inside and the outside of the light exit surface is large, and light emitted from a light emitting element can be efficiently extracted.

BRIEF DESCRIPTION OF THE DRAWINGS

FIG. 4B is a schematic plan view and a schematic side view showing an example of a light-transmissive member of a light emitting device according to an embodiment.

DETAILED DESCRIPTION OF EMBODIMENT

Figure 1:
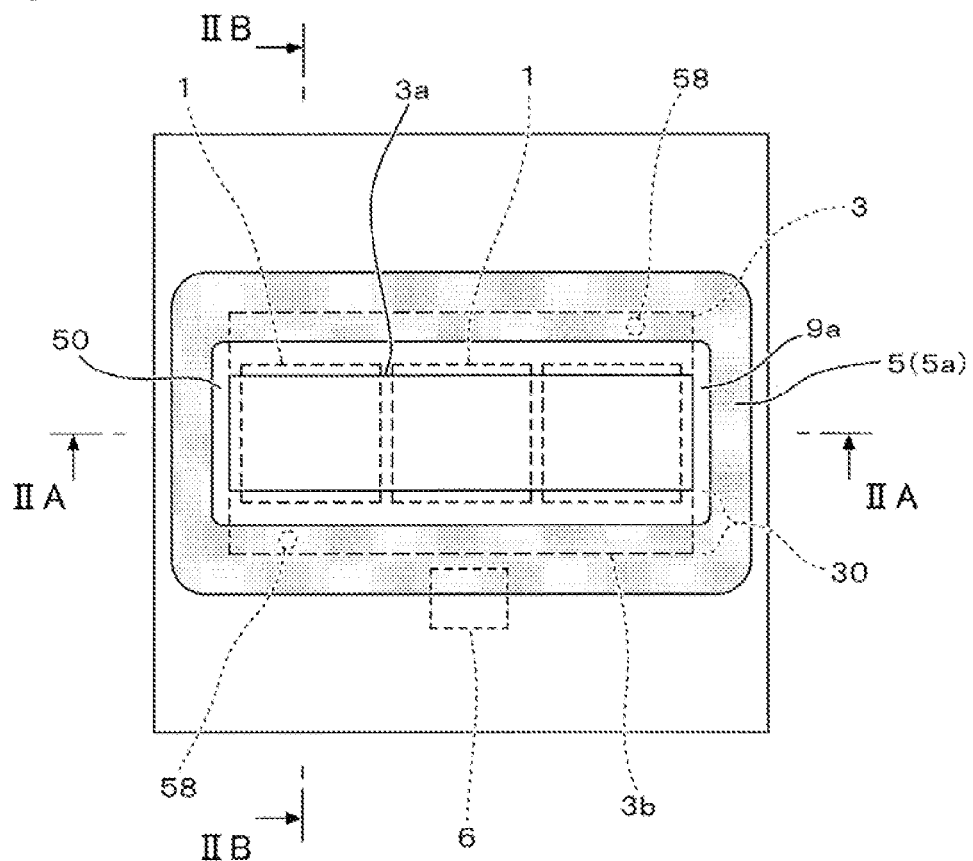
FIG. 1 is a schematic plan view showing an example of a light emitting device according to an embodiment.

In the following, the manufacturing method of an embodiment of the present disclosure and the light-emitting device obtained thereby (hereinafter sometimes referred to as the "light emitting device of an embodiment") will be described with reference to the drawings. However, the embodiments described below are for the purpose of embodying the technical concept of the present invention, and are not intended to limit the present invention. The drawings referred to in the following description are schematic representations of the embodiments of the present disclosure, and therefore, the scale, spacing, and positional relationship of each component may be exaggerated, or some of the components may be omitted. "Cross-sectional view" may refer to an end view showing only the cut surface. Also, in this specification, terms such as "cover" and "covering" are not limited to a case of direct contact, and also encompass a case of indirect coverage (such as in the case where another member is interposed), unless otherwise specified.

Light Emitting Device in an Embodiment

The light emitting device in an embodiment has at least a light-shielding frame, a light-transmissive member, and a light emitting element. More specifically, as shown in FIGS. 1, 2A, and 2B, the light emitting device has a substrate 10, light emitting elements 1 that are mounted on the substrate 10, a light-transmissive member 3 that is provided facing the upper surface (the main light emission surface) of the light emitting elements 1, a first light reflecting member 9a that is provided on a side surface of the light-transmissive member 3, and a light-shielding frame 5 that is provided in contact with the first light reflecting member 9a around the light-transmissive member 3.

Figure 3A:
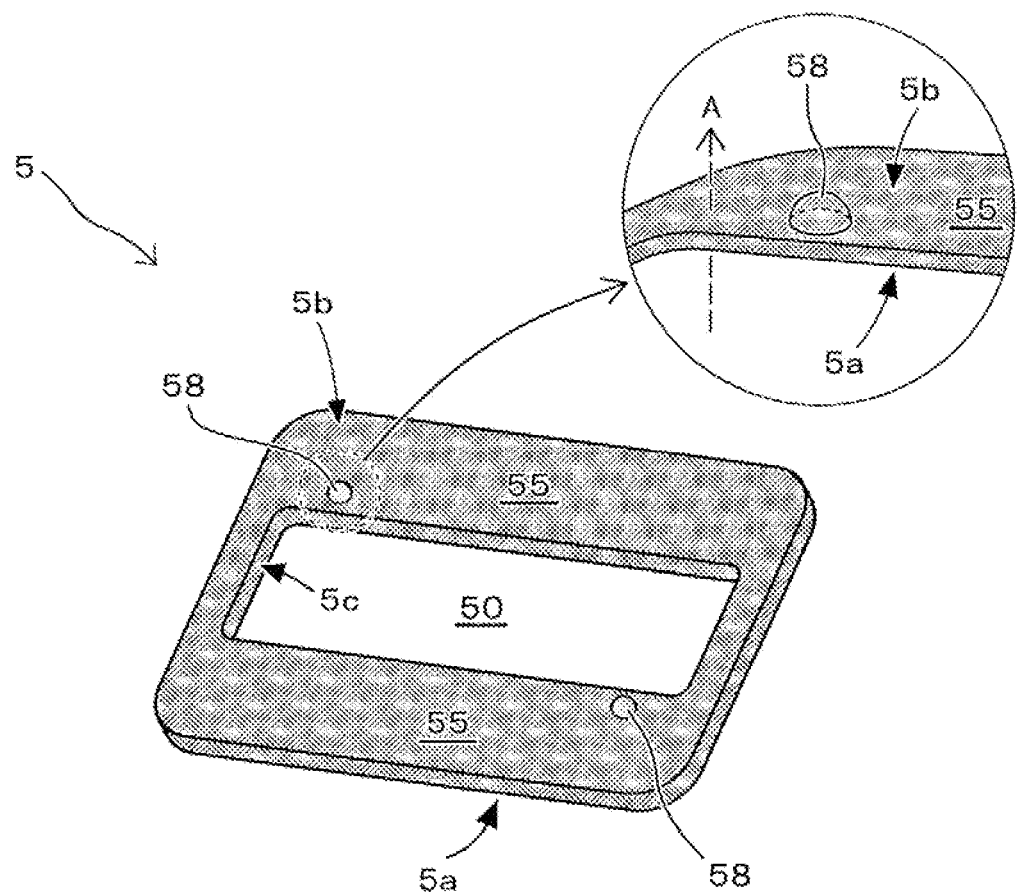
FIG. 3A is a schematic oblique view showing an example of a light-shielding frame of a light emitting device according to an embodiment.
Figure 3B:
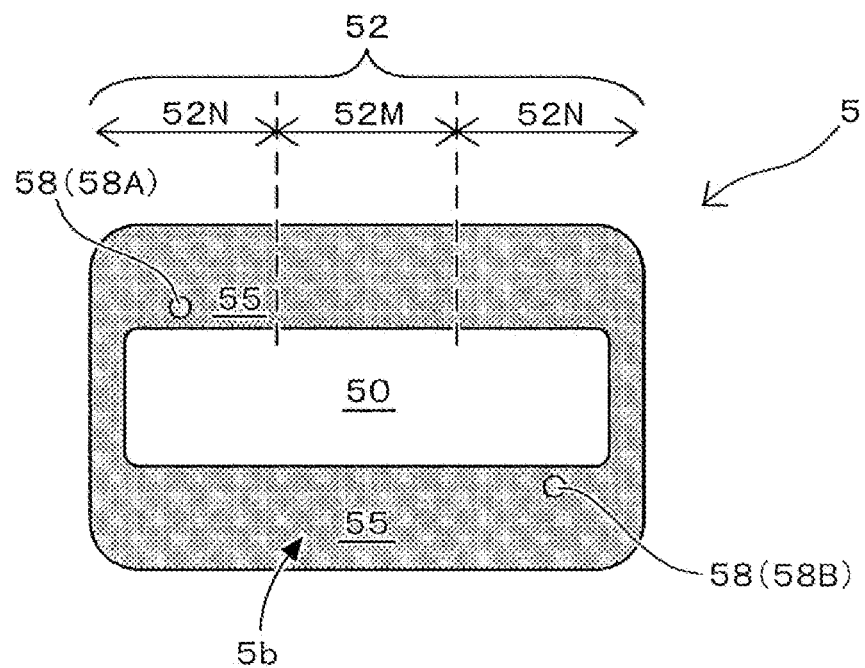
FIG. 3B is a schematic plan view showing an example of a light-shielding frame of a light emitting device according to an embodiment.

As shown in FIGS. 3A and 3B, the light-shielding frame 5 has a first main surface 5a and a second main surface 5b on the opposite side from the first main surface 5a, and is a frame-shaped member that defines a through-hole 50 from the first main surface 5a to the second main surface 5a. In the light-shielding frame 5, the first main surface 5a and the second main surface 5b each have an inner periphery surrounding the through-hole 50, and the light-shielding frame 5 has an inside surface 5c that is contiguous with the inner periphery of the first main surface 5a and the second main surface 5b. The second main surface 5b of the light-shielding frame 5 has at least one convex portion 58. In the light emitting device, the first main surface 5a of the light-shielding frame 5 constitutes a part of the upper surface of the light emitting device.

Figure 2A:
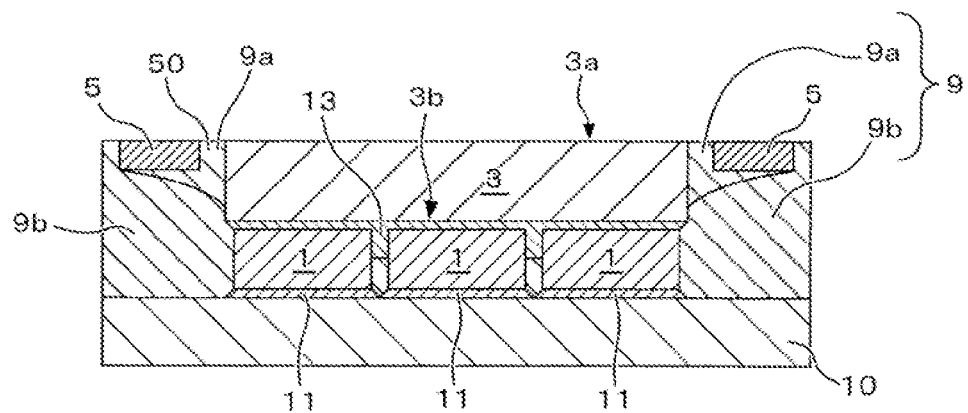
FIG. 2A is a schematic cross-sectional view taken along the IIA-IIA line in FIG. 1.
Figure 2B:
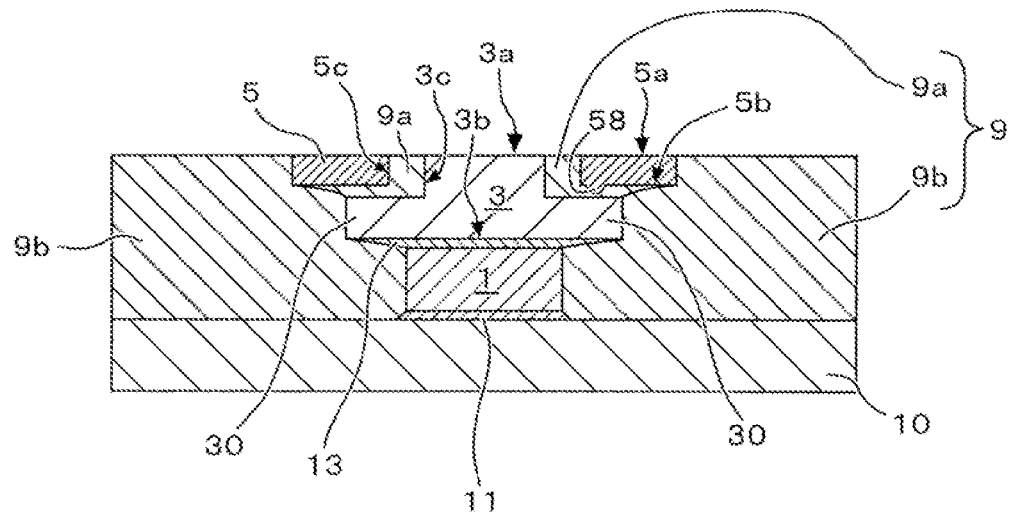
FIG. 2B is a schematic cross-sectional view taken along the IIB-IIB line in FIG. 1.
Figure 4A:
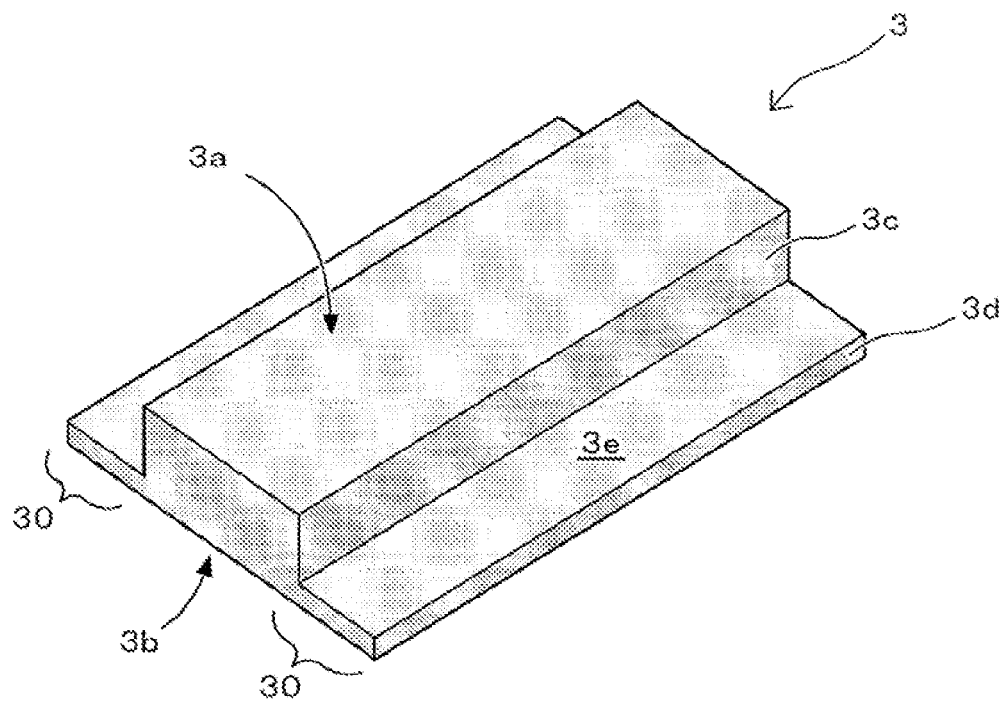
FIG. 4A is a schematic oblique view showing an example of a light-transmissive member of a light emitting device according to an embodiment.

As shown in FIGS. 1, 4A, and 4B, the light-transmissive member 3 has a first surface 3a with an outer periphery that is smaller than the inner periphery of the first main surface 5a of the light-shielding frame 5, a second surface 3b on the opposite side from the first surface 3a, a first side surface 3c that is contiguous with the first surface 3a, a second side surface 3d that is located outside the first side surface 3c and is contiguous with the second surface 3b, and a third surface 3e that is contiguous with the first side surface Sc and the second side surface 3d. The first surface 3a of the light-transmissive member 3 constitutes a part of the upper surface of the light emitting device, and the second surface 3b of the light-transmissive member 3 is joined to the upper surface of the light emitting elements 1.

The light-shielding frame 5 and the light-transmissive member 3 are joined by the first light reflecting member 9a to constitute an optical member 60. In the optical member 60, the light-transmissive member 3 and the light-shielding frame 5 are separated from each other, and the first side surface 3c of the light-transmissive member 3 and the inside surface 5c of the light-shielding frame 5 are joined via the first light reflecting member 9a.

Furthermore, the light emitting device in an embodiment has a second light reflecting member 9b between the first light reflecting member 9a and the substrate 10. The second light reflective member 9b exposes the upper surface of the optical member 60 and covers the side surface of the optical member 60. The second light reflecting member 9b also covers the side surface of the light emitting elements 1 and the upper surface of the substrate 10. The first light reflecting member 9a and the second light reflecting member 9b may be collectively referred to as a "light reflecting member 9" below.

With the light emitting device in this embodiment, the light-transmissive member 3 is disposed in the through-hole 50 of the light-shielding frame 5. In other words, the light-shielding frame 5 is disposed so as to surround the light-transmissive member 3. More specifically, as shown in FIG. 2B, the inside surface 5c of the light-shielding frame 5 and the first side surface 3c of the light-transmissive member 3 are provided so as to be joined via the first light reflecting member 9a. Furthermore, in the light emitting device in this embodiment, as shown in FIG. 1, when viewed in plan view from above (that is, from the light exit surface side of the light emitting device), the first surface 3a of the light-transmissive member 3 is exposed from the light-shielding frame 5 and the first light reflecting member 9a. The first surface 3a of the light-transmissive member 3 and the upper surface of the light-shielding frame 5 are preferably located in substantially the same plane. That is, as shown in FIG. 2B, the first surface 3a of the light-transmissive member 3 and the first main surface 5a of the light-shielding frame 5 are preferably flush with each other.

With the light emitting device in this embodiment, when viewed in plan view from above, the first main surface 5a of the light-shielding frame 5 surrounds the first surface 3a of the light-transmissive member 3, and the first light reflecting member 9a is located between the first main surface 5a of the light-shielding frame 5 and the first surface 3a of the light-transmissive member 3. In other words, in the case where the light emitting device is viewed from above in plan view, the inner periphery of the first main surface 5a of the light-shielding frame 5 is located outside the outer periphery of the first surface 3a of the light-transmissive member 3, and the first light reflecting member 9a is interposed between the first surface 3a of the light-transmissive member 3 and the first main surface 5a of the light-shielding frame 5.

With the light emitting device in this embodiment, the luminance difference between the light exit surface and the area surrounding this surface can be increased, and the light emitted by the light emitting elements can be efficiently extracted.

In the light emitting device in this embodiment, the spacing between the inner periphery of the first main surface 5a of the light-shielding frame 5 and the outer periphery of the first surface 3a of the light-transmissive member 3 is preferably at least 5 μm and no more than 150 μm, and more preferably at least 40 μm and no more than 60 μm. This makes it possible both to increase the luminance difference between the inside and the outside of the outer periphery of the first surface 3a of the light-transmissive member 3, which serves as the light exit surface of the light emitting device, and to efficiently extract the light emitted by the light emitting elements.

The inside surface of the light-shielding frame 5 may be an inclined side surface that is inclined so as to spread out from the first main surface toward the second main surface, or may be a side surface that is substantially perpendicular to the first main surface. This suppresses the wet spreading of the first light reflecting resin covering the inside surface of the light-shielding frame on the first main surface 5a.

In the light emitting device in this embodiment, the second main surface 5b of the light-shielding frame 5 has a convex portion 58. More specifically, the second main surface 5b has a flat portion 55 that is substantially parallel to the first main surface 5a, and a convex portion 58 that is convex in the height direction from the flat portion 55 (that is, the A direction going from the first main surface 5a toward the second main surface 5b).

The light-shielding frame 5 is a member provided on the upper surface of the light emitting device to reduce the luminance of the portion excluding the light exit surface. The light-transmissive member 3 is disposed on the inside of the light-shielding frame 5. The second main surface 5b of the light-shielding frame 5 is the region to which the light reflecting resin is supplied during manufacture.

In the optical member formation step, an optical member in which the generation of voids is suppressed at the first light reflecting member 9a can be obtained by using the light-shielding frame 5 having the convex portion 58 on the second main surface 5b.

Figure 5A:
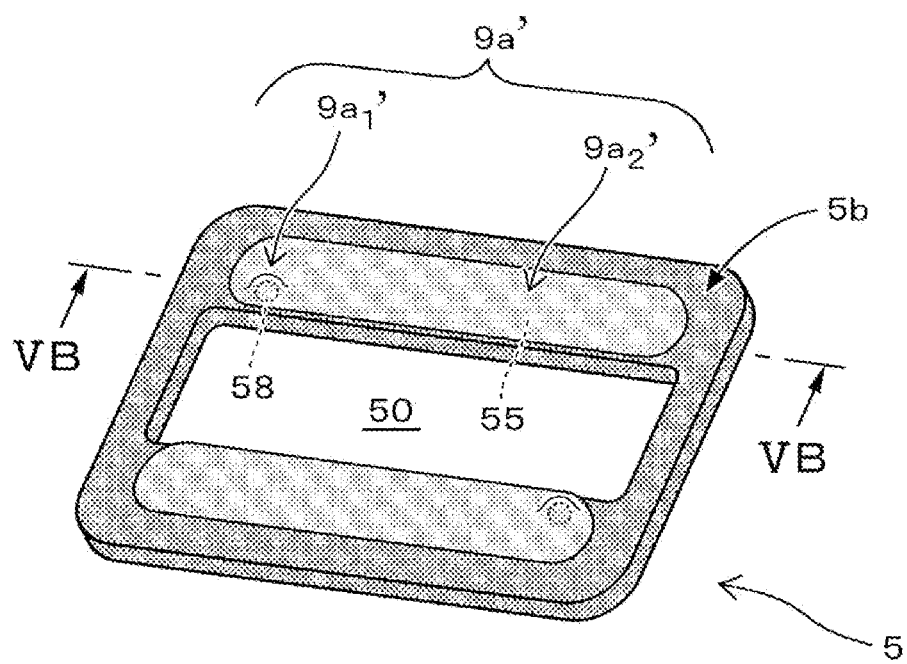
FIG. 5A is a schematic oblique view showing a light reflecting resin supplied to a light-shielding frame as an example of the manufacturing method according to an embodiment.
Figure 5B:
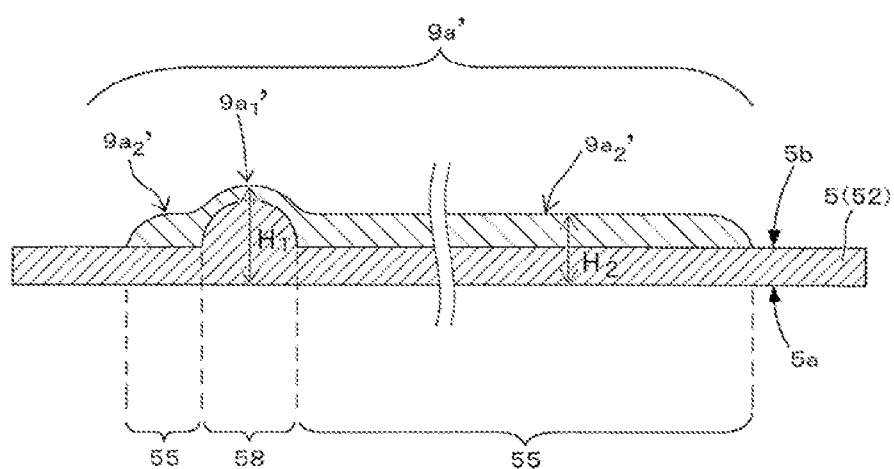
FIG. 5B is a schematic cross-sectional view taken along the VB-VB line in FIG. 5A.

In the light-shielding frame 5, the convex portion 58 corresponds to a thick portion in which the thickness of the light-shielding frame 5 is partially increased. In the case where the light reflecting resin is supplied to this light-shielding frame 5, the height of the light reflecting resin on the light-shielding frame 5 is not constant everywhere, due to the convex portion 58. For example, as shown in FIGS. 5A and 5B, the light reflecting resin 9a' supplied to the second main surface 5b in the light reflecting resin supply step has different heights from one location to the next. That is, the height of a light reflecting resin $9a_1'$ located on the convex portions 58 from the first main surface 5a is greater than the height of a light reflecting resin $9a_2'$ located on the flat portion 55 from the first main surface 5a. In other words, the highest position of the light reflecting resin 9a' is located on the convex portions 58. Thus setting the light reflecting resin provided on the convex portion 58 to have a greater height suppresses the occurrence of voids in the optical member formation step. More specifically, in the optical member formation step, the light reflecting resin 9a' and the third surface 3e of the light-transmissive member 3 are brought into contact with each other to move the light reflecting resin 9a' between the first side surface 3c of the light-transmissive member 3 and the inside surface 5c of the light-shielding frame 5, and at this time the light-transmissive member 3 and the light-reflective resin 9a' can be brought into contact with each other with a time lag because of the convex portion 58. That is, the convex portion 58 can be used as a starting point in the case where the light reflecting resin 9a' moves between the first side surface 3c of the light-transmissive member 3 and the inside surface 5c of the light-shielding frame 5. Providing a starting point makes it possible to control the movement direction of the light reflecting resin 9a' between the first side surface 3c of the light-transmissive member 3 and the inside surface 5c of the light-shielding frame 5. Consequently, in the case where the light reflecting resin 9a' moves between the first side surface 3c of the light-transmissive member 3 and the inside surface 5c of the light-shielding frame 5, air can easily escape to the outside, and this suppresses the generation of voids.

Using an optical member in which voids in the light reflecting member are suppressed further improves the extraction of light from the light emitting device. Furthermore, suppressing the generation of voids improves the joint strength between the constituent elements of the light emitting device.

The overall configuration of the light emitting device in this embodiment and the constituent members will now be described in detail.

In the light emitting device in this embodiment, the light-transmissive member 3 has the first surface 3a, which serves as the light exit surface of the light emitting device, and the second surface 3h on the opposite side from the first surface 3a. The first surface 3a of the light-transmissive member 3 has an outer periphery that is smaller than the inner periphery of the first main surface 5a of the light-shielding frame 5. As shown in FIG. 1, in a plan view from above, the surface area of the first surface 3a of the light-transmissive member 3 is smaller than the surface area of the second surface 3b. In a plan view from above, the outer periphery of the first surface 3a of the light-transmissive member 3 is located to the inside of the outer periphery of the second surface 3b of the light-transmissive member 3. A part of the outer periphery of the first surface 3a of the light-transmissive member 3 may coincide with the outer periphery of the second surface 3b.

Making the surface area of the first surface 3a of the light-transmissive member 3 smaller than the surface area of the second surface 3b allows the light emitted from the light emitting elements 1 incident on the second surface 3b of the light-transmissive member 3 to be emitted from the first surface 3a, which is has a smaller surface area. That is, passing the light through the light-transmissive member 3 reduces the surface area of the light emission surface, which makes it possible to illuminate farther away at high luminance. A light emitting device having a high front luminance is particularly well suited to automotive lighting, such as headlights. In addition, in automotive lighting, there are various regulations regarding the color of the lamps; for example, the color of a headlight is white or pale yellow, and it is stipulated that the color be the same for all headlights.

In the light-transmissive member 3, the first surface 3a and the second surface 3b are of different sizes as mentioned above, and the light-transmissive member 3 has a flange 30. More specifically, as shown in FIGS. 4A and 4B, the light-transmissive member 3 has the first side surface 3c that is contiguous with the first surface 3a, the second side surface 3d that is located to the outside of the first side surface 3c and is contiguous with the second surface 3b, and the third surface 3e that is contiguous with the first side surface 3c and the second side surface 3d. As shown in the drawing, in the light-transmissive member 3, the flange 30 is constituted by a part of the second surface 3b and by the third surface 3e and the second side surface 3d. Put simply, the light-transmissive member 3 is provided with the flange 30 because the surface area of the second surface 3b is larger than the surface area of the first surface 3a.

At least a part of the outer periphery of the second surface 3b of the light-transmissive member 3 is located to the outside of the inner periphery of the through-hole 50 of the light-shielding frame 5 in the case where the light emitting device is viewed from above. With the light emitting device in this embodiment shown in FIG. 1, the portion of the outer periphery of the second surface 3b of the light-transmissive member 3 that is contiguous with the second side surface 3d is located to the outside of the inner periphery of the through-hole 50 when viewed in plan view from above. In the case where the outer periphery of the second surface 3b of the light-transmissive member 3 is rectangular, for example, then at least one side of the outer periphery of the second surface 3b, such as two opposing sides, and preferably the two opposing long sides, are located to the outside of the inner periphery of the light-shielding frame 5.

That is, with the light emitting device in this embodiment, in the case where the light emitting device is viewed from above in plan view, first surface 3a of the light-transmissive member 3 and the upper surface of the light reflective member 9a that surrounds the outer periphery of this first surface 3a are disposed on the inside of the light-shielding frame 5. Here, the light-transmissive member 3 is located in the region inside the light-shielding frame 5, in at least the part below the first light reflecting member 9a. Consequently, even though cracking or peeling should occur in the first light reflecting member 9a between the first surface 3a of the light-transmissive member 3 and the first main surface 5a of the light-shielding frame 5, the light leaking from the first light reflecting member 9a will tend to be only the light emitted from the light-transmissive member 3.

In the case where the outer periphery of the second surface 3b of the light-transmissive member 3 is substantially rectangular, at least the two opposing long sides of the outer periphery of the second surface 3b are preferably configured to be located outside the inner periphery of the light-shielding frame 5. This makes it possible to obtain a light emitting device having a light distribution pattern in which a wider spread is ensured in the lateral direction (that is, the long side direction) than in the vertical direction (that is, the short side direction), which is suited to automotive lamps and the like.

Furthermore, on the upper surface of the light emitting device, any light leaking from the light reflecting member 9 covered by the light-shielding frame 5 will be blocked by the light-shielding frame 5. Therefore, even though cracking or peeling should occur in the light reflecting member 9 located to the side of the light emitting elements the light emitted from the side surface of the light emitting elements 1 can be prevented even more effectively from leaking out through a crack and/or a peeled portion and being transmitted to the light exit surface.

In one mode of the light emitting device in this embodiment, as shown in FIG. 1, at least a part of the outer periphery of the first surface 3a of the light-transmissive member 3 is located on the inside of the outer periphery of the light emitting elements 1 when viewed in plan view from above. For example, in the case where the first surface 3a of the light-transmissive member 3 has a substantially rectangular shape having long and short sides, the long sides are preferably located more to the inside than the outer periphery of the light emitting elements 1 located on the long side of the light-transmissive member 3 in plan view.

Consequently, the light emitted from the plurality of the light emitting elements 1 can be converged and emitted from the first surface 3a of the light-transmissive member 3. This means that the light emitted by the light emitting elements 1 can be emitted from the first surface 3a of the light-transmissive member 3, which is the light exit surface of the light emitting device, in a state of having a higher luminous flux density.

Substrate

The substrate 10 is a member that supports the light emitting elements 1, etc. The substrate 10 has, at least on its surface, wiring that is electrically connected to the light emitting elements 1. The main material of the substrate 10 is an insulating material, and preferably one through which light from the light emitting elements 1 and light from the outside does not readily pass. Examples of the main material of the substrate 10 include one or more types of resin selected from a group having phenol resin, epoxy resin, silicone resin, polyimide resin, BT resin, polyphthalamide and so forth, or ceramics such as aluminum oxide and aluminum nitride. In the case where a resin is used, one or more types of inorganic filler selected from among glass fiber, silicon oxide, titanium oxide, aluminum oxide, and the like may be mixed into the resin as needed. This improves mechanical strength, reduces the coefficient of thermal expansion, improves light reflectance, and so forth. Also, the substrate 10 may be one in which wiring is formed on the surface of a metal member via an insulating material. This wiring is formed in a specific pattern on the insulating material. Examples of the wiring material include one or more types selected from among gold, silver, copper, iron, titanium, palladium, nickel, chromium, ruthenium, tungsten, and aluminum. The wiring can be formed by plating, vapor deposition, sputtering, or another such method.

Light Emitting Elements

A light emitting diode preferably use as the light emitting element 1. The light emitting element 1 can be selected for any wavelength. For example, at least one type selected from nitride semiconductors (InXAlYGa1−X−YN, 0≤X, 0≤Y, X+Y≤1), ZnSe and GaP can be used as blue and green light emitting elements. GaAlAs and AlInGaP can be used as red light emitting elements. Furthermore, semiconductor light-emitting elements made of other materials can also be used. The composition, light-emitting color, size, and number of light-emitting elements to be used can be selected according to the purpose. In the case of a light-emitting device with phosphors, a nitride semiconductor (InXAlYGa1−X−YN, 0≤X, 0≤Y, X+Y≤1) that can emit light at short wavelengths that can efficiently excite the phosphors is suitable. The emission wavelength of the light emitting device 1 can be selected in various ways depending on the material of the semiconductor layer and its degree of mixed crystal.

The light emitting elements 1 used in the light emitting device in this embodiment have positive and negative electrodes on the same surface side, for example. As shown in FIG. 2A, the light emitting elements 1 may be flip-chip mounted on the substrate 10 via conductive bonding members 11. In FIG. 2A, the conductive bonding members 11 connected to the positive and negative electrodes of the light emitting elements 1 are drawn in a simplified form, but are actually provided so as to be connected to each of the positive and negative electrodes provided on the same surface side. The positive and negative electrodes of the light emitting elements 1 are connected to the positive and negative wiring provided on the substrate 10 via the respective conductive bonding members 11. Also, the light emitting elements 1 are placed on the substrate 10 with the electrode forming surface as the lower surface, and the upper surface that is opposite this lower surface is the main light exit surface. Since these light emitting elements 1 can be connected on the substrate 10 by using the conductive bonding members 11, such as bumps or a conductive paste; the contact surface area between the electrodes and the substrate can be larger, and the connection resistance can be lower, than with light emitting elements that are connected by metal wires or the like. The conductive bonding members include, for example, bumps made of Au, Ag, Cu or alloys containing these materials; solders such as Sn—Bi, Sn—Cu, Sn—Ag and Au—Sn; eutectic alloys such as alloys composed mainly of Au and Sn, an alloy composed mainly of Au and Si or an alloy composed mainly of Au and Ge; or a conductive paste such as Au; Ag or Pd, an anisotropic conductive material such as ACP or ACF, a brazing material of a low-melting-point metal, or a conductive adhesive that combines these materials.

The plan view shape of the light emitting elements 1 is rectangular; for example. The light emitting elements 1 are produced, for example, by laminating a nitride semiconductor layer on a light-transmissive support substrate, and the support substrate side serves as the main light exit surface (that is; the upper surface) of the light emitting elements 1. The support substrate may be removed by polishing, laser lift-off, or the like.

Light-Transmissive Member

The light-transmissive member 3 is a member that transmits the light emitted from the light emitting elements 1 to the outside. The light-transmissive member 3 transmits at least 60% of the light emitted from the light emitting elements 1 and/or light emitted from the light emitting elements 1 that has undergone wavelength conversion (such as light having a wavelength in the band of 320 to 850 nm). A member that will transmit at least 70% of the light is preferable.

The light-transmissive member 3 has the first surface 3a serving as substantially the light exit surface of the light emitting device, the second surface 3b that is on the opposite side from the first surface 3a, a first side surface 3c that is contiguous with the first surface 3a, a second side surface 3d that is located on the outside of the first side surface 3c and is contiguous with the second surface 3b, and a third surface 3e that is continuous with the first side surface 3c and the second side surface 3d. The surface area of the second surface 3b of the light-transmissive member 3 is larger than the surface area of the first surface 3a of the light-transmissive member 3. As discussed above, the light-transmissive member 3 has a flange 30 on the side portion thereof. The flange 30 is constituted by a part of the second surface 3b and by the third surface 3e and the second side surface 3d.

The light-transmissive member 3 may be formed, for example, from inorganic materials or resins. The inorganic materials include glass, ceramic, sapphire or another such inorganic material. The resins include one or more types of silicone resin, modified silicone resin, epoxy resin, modified epoxy resin, acrylic resin, phenol resin, fluororesin or a hybrid resin thereof.

The light-transmissive member 3 may contain a light diffusing material and/or a phosphor capable of converting the wavelength of at least some of the incident light. Examples of a light-transmissive member containing a phosphor include a sinter of a phosphor and one of the above-mentioned materials to which a phosphor is added. Also, a layer containing a phosphor may be provided to the surface of a molded article made of resin, glass, ceramic, or the like. The thickness of the light-transmissive member 3 from the first surface 3a to the second surface 3h is about 50 μm to 300 μm, for example.

As shown in FIG. 2A, the light-transmissive member 3 and the light emitting elements 1 may be joined via a light guide member 13, for example. Also, instead of using the light guide member 13, the light-transmissive member 3 and the light emitting elements 1 may be joined by direct joining method such as pressure-bonding, surface activation bonding, atomic diffusion bonding, hydroxyl group bonding, or the like.

A phosphor that can be contained in the light-transmissive member 3 is one that can be excited by the emission from the light emitting elements 1. For instance, examples of phosphors that can be excited by a blue light emitting element or an ultraviolet light emitting element include one or more types selected from among cerium-activated yttrium aluminum garnet phosphors (YAG:Ce); cerium-activated lutetium aluminum garnet phosphors (LAG:Ce); europium- and/or chromium-activated nitrogen-containing calcium aluminosilicate phosphors ($CaO-Al_2O_3-SiO_2$:Eu); europium-activated silicate phosphors ($(Sr,Ba)_2SiO_4$:Eu); β-SiAlON phosphors; nitride phosphors such as CASN phosphors represented by $CaAlSiN_3$:Eu, SCASN phosphors represented by $(Sr,Ca)AlSiN_3$:Eu; KSF phosphors represented by $K_2SiF_6$:Mn; sulfide phosphors, quantum dot phosphors, and the like. These phosphors can be combined with a blue light emitting element or an ultraviolet light emitting element to produce a light emitting device having the desired emission color (such as a white light emitting device).

The plan view shape of the first surface 3a and the second surface 3b of the light-transmissive member 3 is substantially rectangular, for example. The term "rectangular" here includes a square shape.

For example, in the case where a plurality of light emitting elements 1 are joined to the second surface 3b of a single light-transmissive member 3, the second surface 3b of the light-transmissive member 3 preferably has a shape and size that will encompass all of the light emitting elements 1.

In the case where the light-transmissive member 3 has a rectangular shape in plan view, the flange 30 is preferably provided so as to form a pair on the opposite sides of the light-transmissive member 3. That is, the flange 30 is preferably provided for at least one pair of opposing sides of the rectangle. This makes it easier for the light-transmissive member 3 and the light-shielding frame 5 to be joined by a first covering member. As shown in FIG. 1, in the light-transmissive member 3, the first surface 3a and the second surface 3b have a rectangular shape in plan view, for example. In the case where the light-transmissive member 3 has a rectangular shape in plan view as described above, the flange 30 is preferably provided so as to form a pair at least on the opposing long sides of the rectangle.

Light-Shielding Frame

The light-shielding frame 5 is a member provided on the upper surface of the light emitting device to reduce the luminance of the portion other than the light exit surface. In order to reduce the luminance of the portion other than the light exit surface, it is necessary to block any light that leaks to the outside from somewhere other than the first surface 3a of the light-transmissive member 3. With this function in mind, the light-shielding frame 5 is preferably, a member composed of a material that reflects and/or absorbs light without transmitting light, or a member whose surface is provided with a film composed of a material that reflects and/or absorbs light, for example.

As shown in FIGS. 3A and 3B, the light-shielding frame 5 has a first main surface 5a, a second main surface 5b on the opposite side from the first main surface 5a, and a through-hole 50 extending from the first main surface 5a to the second main surface 5b. The light-shielding frame 5 is a frame-shaped member that defines the through-hole 50. The light-shielding frame 5 has a plate shape in which the first main surface 5a and the second main surface 5b are substantially flat and substantially parallel to each other, but has some parts where the thickness thereof (that is, the shortest distance from the first main surface 5a to the second main surface 5b) is not constant. More specifically, the light-shielding frame 5 has a convex portion 58 whose thickness is locally increased. The convex portion 58 is provided on the second main surface 5b, which is on the opposite side from the first main surface 5a on the light exit surface side of the light emitting device.

The material constituting the light-shielding frame 5 can be selected from among resins (including fiber-reinforced resins), ceramics, glass, paper, metal, and so forth, and composite materials composed of two or more of these materials. The light-shielding frame 5 may be constituted by a metal frame made of metal, or a frame having a metal film on its surface, for example, given that these materials have excellent light-shielding properties and are resistant to deterioration. The metallic materials includes Cu, Fe, Ni, Cr, Al, Au, Ag, Ti, or alloys thereof.

Even more preferable is for the light-shielding frame 5 to function not only to suppressing light leakage from the inside of the light emitting device, but also to suppress the reflection of light from the outside. Examples of the function of suppressing the reflection of light from the outside include having fine recesses and protrusions on the surface of the first main surface 5a on the light exit surface side, and using a material having high light absorptivity. Examples of fine recesses and protrusions include those having an average arithmetic roughness Ra of at least 0.5 μm and no more than 1.0 μm. In the case where the surface of the light-shielding frame 5 has fine recesses and protrusions, the surface of the light-shielding frame becomes more wettable with liquids, and the resin constituting the various members tends to wet and spread out over the surface of the light-shielding frame. Therefore, the edge of the first main surface 5a of the light-shielding frame 5 is preferably not subjected to fine texturing, for example. Examples of materials having a high light absorptivity include black nickel plating and black chrome plating.

The thickness of the light-shielding frame 5 at the flat portion 55 is preferably about 20 to 200 μm, and more preferably about 30 to 80 μm, in consideration of lightness, deformation resistance, etc., while maintaining the strength in the case where the frame is used in a light emitting device.

The light-shielding frame 5 may be configured such that its outer periphery coincides with the outer periphery of the light emitting device in plan view, or the outer periphery of the light-shielding frame 5 may be provided so as to be located inside the outer periphery of the light emitting device. In the case where the outer periphery of the light-shielding frame 5 is provided so as to be located inside the outer periphery of the light emitting device, the light-shielding frame 5 is not disposed on the dividing line, and misalignment of the light-shielding frame 5 during division is suppressed, in a division step of dividing the light emitting device into unit regions (that is, into regions that become individual light emitting devices) in the course of using a composite substrate in the manufacturing process.

In plan view, the width of the light-shielding frame 5 surrounding the light-transmissive member 3 (that is, the shortest distance from the inner periphery to the outer periphery of the light-shielding frame 5) is preferably at least 130 μm in view of increasing the luminance difference between the inside and the outside of the outer periphery of the first surface 3a serving as the light exit surface of the light emitting device in the light-transmissive member 3. Also, this width is preferably at least 500 μm considering the ease of handling in the manufacturing process, for example.

The width of the light-shielding frame 5 may be a constant width around the entire periphery, or may vary from one location to the next. In the case where the width of the light-shielding frames 5 varies, the width is preferably at least 130 μm all the way around the periphery, the width is preferably at least 500 μm locally.

Light Reflective Member

The light reflecting member 9 may include the first light reflecting member 9a, which joins the light-shielding frame 5 and the light-transmissive member 3, and the second light reflecting member 9b, which is provided so as to cover a side surface of the light emitting elements 1 between the first light reflecting member 9a and the substrate 10.

The light reflecting; member 9 covers a side surface of the light emitting elements 1 and a side surface of the light-transmissive member 3. The light reflecting member 9 reflects the light emitted from the side surface of the light emitting elements 1 and the side surface of the light-transmissive member 3 so that light is emitted from the first surface 3a of the light-transmissive member 3, which is the light exit surface of the light emitting device. Thus providing the light reflecting member 9 that covers the side surface of the light emitting elements 1 and the side surface of the light-transmissive member 3 allows light to be extracted more efficiently from the light emitting device. The light reflecting member 9 has a reflectivity of at least 60%, and preferably has a reflectivity of at least 90%, with respect to the light from the light emitting elements 1. The light reflecting member 9 can be formed, for example, from a resin containing a light reflecting substance (also referred to as a light reflecting resin). As will be described in detail below, the first light reflecting member 9a and the second light reflecting member 9b are formed separately, and may be formed using different light reflecting resins, or may be formed from the same light reflecting resin.

The resins of the base material constituting the light reflecting member 9 include one or more types of silicone resin, modified silicone rein, epoxy resin, modified epoxy resin, polyester resin, polyimide resin, modified polyimide resin, polyphthalamide (PPA), polycarbonate resin, polyphenylene sulfide (PPS), liquid crystal polymer (LCP), ABS resin, phenol resin, acrylic resin, polybutylene terephthalate (PBT) resin and the like, and a hybrid resin thereof. Among these, a silicone resin is preferably used as the resin of the base material constituting the light reflecting member 9 because of its excellent heat resistance and light resistance. The light reflecting substance is preferably a member that does not readily absorb light from the light emitting elements and has a large difference in refractive index with respect to the resin of the base material. The light reflecting substances include at least one selected from titanium oxide, silicon oxide, zirconium oxide, magnesium oxide, yttrium oxide, calcium carbonate, calcium hydroxide, calcium silicate, niobium oxide, zinc oxide, barium titanate, potassium titanate, magnesium fluoride, aluminum oxide, aluminum nitride, boron nitride, mullite and the like. Among these, titanium oxide, which has a relatively high refractive index, is particularly favorable in terms of light reflection. Also, the light reflecting substance may be particles that have a refractive index different from that of the resin of the base material, and are dispersed in the resin of the base material. The reflectivity of the resulting light reflecting member will vary depending on the material of the light reflecting substance, the concentration of the light reflecting substance in the resin, and so forth. Consequently, the desired material, concentration, etc., of the light reflecting substance may be adjusted as dictated by the shape and/or size of the light emitting device.

Also, the light reflecting member may contain a filler for adjusting the viscosity, other pigments, a phosphor, or the like in addition to the light reflecting substance. In particular, in the case where the light-transmissive member 3 contains a phosphor, the second light reflecting member 9b that covers the side surface of the light emitting elements 1 can also be made to contain a phosphor, which makes it less likely that the light emission color of the light emitting elements 1 will be visible from the side surface of the light emitting device.

Light Guide Member

In the light emitting device, the light-transmissive member 3 and the light emitting elements 1 can be joined via the light guide member 13. The light guide member 13 is interposed between the light emitting elements 1 and the light-transmissive member 3 and joins the two together. As shown in FIG. 2A, the light guide member 13 may cover all or part of the side surface of the light emitting elements 1. The light guide member 13 configured in this way can efficiently guide the light emitted from the upper surface and the side surface of the light emitting elements 1 to the light-transmissive member 3.

It is preferable to use a resin for the light guide member 13 from the viewpoint of ease of handling and working. The resin used for the light guide member 13 is preferably one that is light-transmissive, and the resins listed as examples of the resin of the base material of the light reflective member 9 may be used.

Other Members

The light emitting device may optionally have another semiconductor element such as a protective element, or an electronic component, or the like. These members are preferably disposed on the substrate 10 and embedded in the light reflecting member 9. Also, these members may be electrically connected to the light emitting device via the wiring of the substrate 10. Also, at least some of the parts are preferably disposed so as to overlap the light-shielding frame 5 in plan view in order to reduce the size of the light emitting device. The light emitting device shown in FIG. 1 is provided with a protective element 6. This protective element 6 is embedded in the light reflecting member 9 so that a part of the protective element 6 will be located directly below the light-shielding frame 5.

Method for Manufacturing Light Emitting Device in Embodiment

The method for manufacturing a light emitting device in this embodiment includes at least a disposing step of disposing light emitting elements on a substrate; a light-shielding frame preparation step of preparing a light-shielding frame; a light reflecting resin supply step of supplying a light reflecting resin to the light-shielding frame; a light-transmissive member preparation step of preparing a light-transmissive member; an optical member formation step of forming an optical member in which a light-shielding frame and a light-transmissive member are joined by a light reflecting; member; and an optical member joining step of joining the light emitting elements and the optical member.

The light emitting device in this embodiment shown in FIGS. 1, 2A, and 2B can be obtained by the manufacturing method in this embodiment, for example. The manufacturing method in this embodiment will now be described with reference to the drawings.

Disposing Step

Figure 6A:
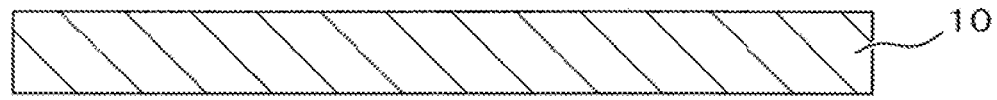
FIG. 6A is a schematic cross-sectional view showing an example of a manufacturing method according to an embodiment.
Figure 6B:
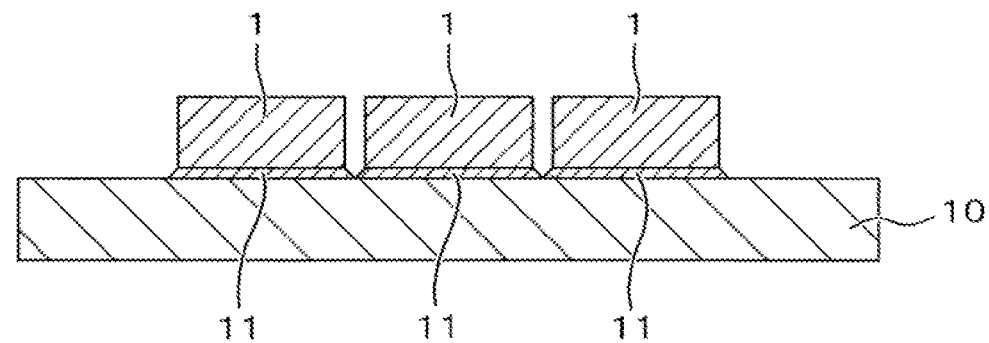
FIG. 6B is a schematic cross-sectional view showing an example of a manufacturing method according to an embodiment.

Here, the light emitting elements 1 are placed on the substrate 10. For example, as shown in FIGS. 6A and 6B, one or more light emitting elements 1 are flip-chip mounted on the substrate 10. More specifically, for example, light emitting elements 1 having positive and negative electrodes on the same surface side are joined by the conductive joining members 11 so that the surface having the positive and negative electrodes is opposite the wiring provided on the substrate 10. In FIG. 6B, as in FIG. 2A, etc., the illustration is simplified, without distinguishing between the conductive joining members 11 connected to the positive and negative wiring provided on the substrate 10 and the positive and negative electrodes of the light emitting elements 1.

The light emitting elements 1 can be prepared by going through all or part of the manufacturing process, such as a step of growing semiconductors. Alternatively, the light emitting elements 1 can be purchased or otherwise procured.

Light-Shielding Frame Preparation Step

Here, a light-shielding frame 5 having a first main surface 5a, a second main surface 5b on the opposite side thereof, and a through-hole 50 extending between the first main surface 5a and the second main surface 5b is prepared. As shown in FIGS. 3A and 3B, the light-shielding frame 5 has a convex portion 58 on its second main surface 5b. The convex portion 58 of the light-shielding frame 5 has a form in which a part of the flat portion 55 of the second main surface 5b projects outward. For example, the light-shielding frame 5 may be prepared by subjecting a plate-shaped member having a light-shielding properly and having a convex portion in advance to machining, such as cutting, punching, and/or pressing, to form a through-hole 50. Also, the light-shielding frame 5 may be prepared by separately forming a convex portion on a flat frame-shaped light-shielding frame precursor that defines the through-hole 50 (this will be described below).

Furthermore, the light-shielding frame 5 may be obtained by purchasing or otherwise procuring a material that has been pre-machined into the above-mentioned desired shape including the convex portion 58.

Light Reflecting Resin Supply Step

In this step, the light reflecting resin 9a' is supplied to the second main surface 5b of the light-shielding frame 5.

Figure 7A:
FIG. 7A is a schematic cross-sectional view showing an example of a manufacturing method according to an embodiment.

The light reflecting resin 9a' is preferably supplied to the light-shielding frame 5 by fixing the light-shielding frame 5 on a sheet or other such support. More specifically, as shown in FIG. 7A, the light-shielding frame 5 is fixed on the sheet 4 so that the first main surface 5a of the light-shielding frame 5 is opposite the upper surface of the sheet 4. A plurality of light-shielding frames may be individually disposed on the sheet, or a plurality of light-shielding frames that are linked in the row direction and/or the column direction may be prepared and disposed collectively on the sheet. The sheet here may be an adhesive heat-resistant sheet. Polyimide is an example of the base material of the sheet.

Figure 7B:
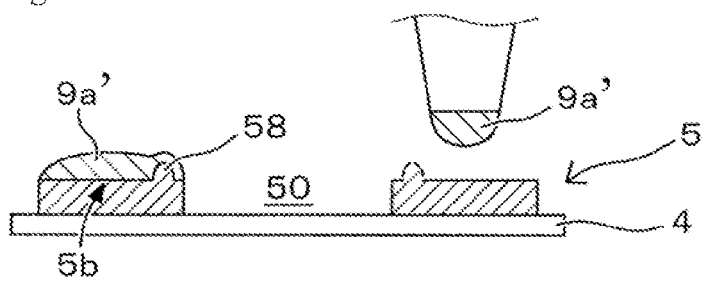
FIG. 7B is a schematic cross-sectional view showing an example of a manufacturing method according to an embodiment.

In the light reflecting resin supply step, as shown in FIG. 7B, the light reflecting resin 9a' that is in contact with the convex portion 58 is supplied to the second main surface 5b of the light-shielding frame 5. In this process, the light reflecting resin 9a' is supplied so that the convex portion 58 is at least partially covered by the light reflecting resin 9a', and preferably the entire convex portion 58 is covered by the light reflecting resin 9a'.

The amount in which the light reflecting resin 9a' is supplied is an amount that will allow the light reflecting resin to be disposed between the first side surface 3c of the light-transmissive member 3 and the inside surface 5c of the light-shielding frame 5, and between the third surface 3e of the light-transmissive member 3 and the second main surface 5b of the light-shielding frame 5. For example, the amount and the viscosity are preferably adjusted so that it is supplied, the light reflecting resin 9a' will wet and spread out over substantially the entire second main surface 5b of the light-shielding frame 5, but will not wet and spread out over the inside surface 5c of the light-shielding frame 5.

The light reflecting resin 9a' may be supplied by any method known in this field. For example, the light reflecting resin 9a' may be supplied to the light-shielding frame 5 by using the nozzle of a resin ejection device to continuously or intermittently discharge the light reflecting resin 9a' from the tip of the nozzle onto the second main surface 5b. For example, the light reflecting resin 9a' can be linearly supplied onto the light-shielding frame 5 by moving the nozzle while intermittently discharging the light reflecting resin 9a' from the nozzle.

The viscosity of the light reflecting resin 9a' during is supply is at least 5 Pa·s and no more than 15 Pa·s, for example. This makes it easier to ensure the flow of the light reflecting resin 9a' between the light-transmissive member 3 and the through-hole 50, and helps prevent the light reflecting resin 9a' from wetting and spreading out over the first surface 3a of the light-transmissive member 3.

Light-Transmissive Member Preparation Step

In this step, the plate-shaped light-transmissive member 3 having the flange 30 is prepared. More specifically, as shown in FIGS. 1, 4A and 4B, a light-transmissive member 3 is prepared that has a first surface 3a having an outer periphery that is smaller than the inner periphery of the first main surface 5a of the light-shielding frame 5, a second surface 3b on the opposite side thereof, a first side surface 3c that is contiguous with the first surface 3a, a second side surface 3d that is located to the outside of the first side surface 3c and is contiguous with the second surface 3b, and a third surface 3e that is continuous with the first side surface 3c and the second side surface 3d.

The light-transmissive member 3 can be produced by any conventional method. For instance, a plate-shaped light-transmissive member 3 provided with a flange 30 may be produced by cutting with a blade or other such machining means. Also, a light-transmissive member 3 that has been worked into the desired shape ahead of time may be obtained by purchase or the like.

Optical Member Formation Step

FIGS. 7C to 7F are cross-sectional views of the optical member formation step.

Here, an optical member 60 is obtained in which the light-shielding frame 5 and the light-transmissive member 3 are joined by the first light reflecting member 9a. More specifically, the light reflecting resin 9a' on the light-shielding frame 5 is moved between the light-transmissive member 3 and the light-shielding frame 5 as the light-transmissive member 3 is put in place, and the resin is then cured to form the first light reflective member 9a. As a result, an optical member 60 is obtained in which the light-shielding frame 5 and the light-transmissive member 3 are supported by the first light reflecting member 9a.

Figure 7C:
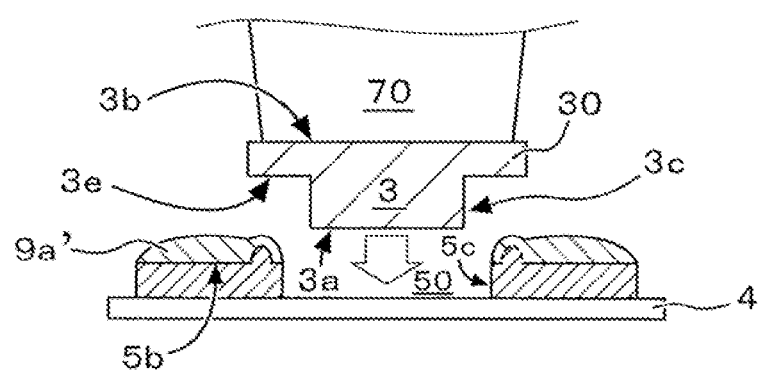
FIG. 7C is a schematic cross-sectional view showing an example of a manufacturing method according to an embodiment.
Figure 7D:
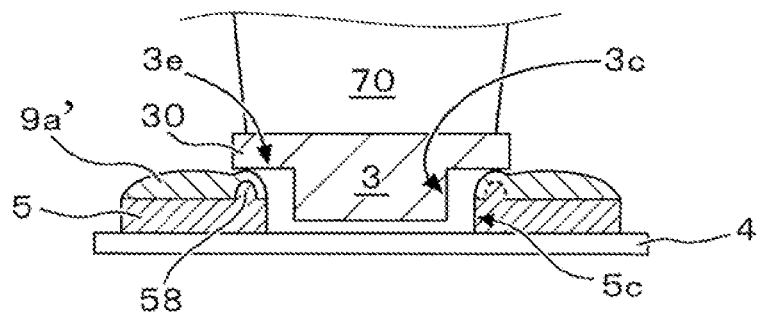
FIG. 7D is a schematic cross-sectional view showing an example of a manufacturing method according to an embodiment.
Figure 7E:
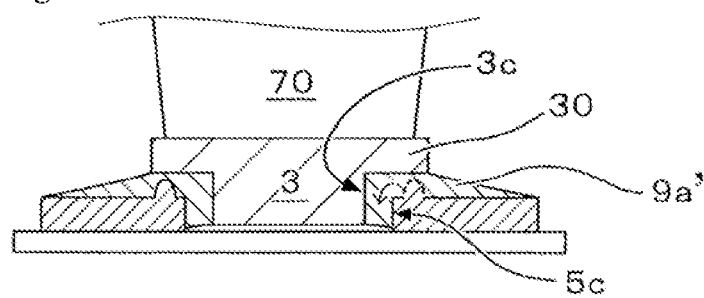
FIG. 7E is a schematic cross-sectional view showing an example of a manufacturing method according to an embodiment.

As shown in FIGS. 7C to 7E, in the optical member formation step, the light-transmissive member 3 is disposed in the through-hole 50 of the light-shielding frame 5 at a position where the first side surface 3c of the light-transmissive member 3 and the inside surface 5c of the light-shielding frame 5 are separated from each other. In the course of this, as shown in FIGS. 7D and 7E, the light reflecting resin 9a' is pressed in the case where the third surface 3e of the light-transmissive member 3 and the light reflecting resin 9a' come into contact with each other, and the light reflecting resin 9a' moves along the surface of the light-shielding frame 5 and the light-transmissive member 3.

Consequently, the light reflecting resin 9a' is disposed between the first side surface 3c of the light-transmissive member 3 and the inside surface 5c of the through-hole 50 of the light-shielding frame 5. The light reflecting resin 9a' is then cured to form the first light reflecting member 9a. This makes it possible to obtain an optical member 60 in which the light-shielding frame 5 and the light-transmissive member 3 are joined by the first light reflecting member 9a.

Figure 7F:
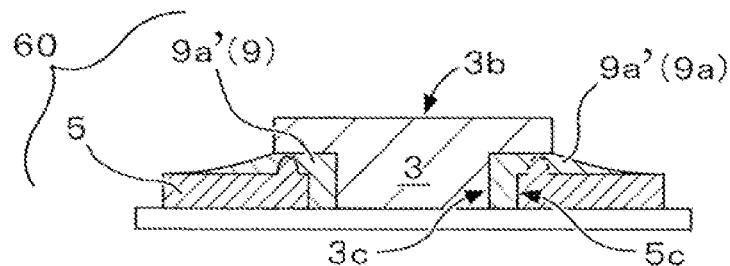
FIG. 7F is a schematic cross-sectional view showing an example of a manufacturing method according to an embodiment.

As shown in FIG. 7F, a sink mark is produced on the surface of the first light reflecting member 9a between the light-shielding frame 5 and the light-transmissive member 3. That is, the light reflecting resin 9a' disposed on the light-shielding frame 5 moves between the light-shielding frame 5 and the light-transmissive member 3 by being pressed by the light-transmissive member 3, and any light reflecting resin 9a' that remains on the light-shielding frame 5 tries to maintain a smaller surface area due to surface tension, resulting in a shape that conforms to the light-transmissive member 3.

As shown in FIGS. 7C to 7F, in the case where the light-transmissive member 3 is disposed in the through-hole 50 of the light-shielding frame 5, the third surface 3e of the light-transmissive member 3 preferably comes into contact with the light reflecting resin 9a' before the first surface 3a of the light-transmissive member 3 comes into contact with the sheet 4. More specifically, the light-transmissive member 3 is brought into contact with the light reflecting resin 9a' on the light-shielding frame 5 in the course of disposing the light-transmissive member 3 in the through-hole 50 of the light-shielding frame 5, such that the first surface 3a of the light-transmissive member 3 is opposite the sheet 4 at a position where the first side surface 3c of the light-transmissive member 3 and the inside surface 5c of the light-shielding frame 5 are separated from each other. Consequently, the light reflecting resin 9a' is pressed by the light-transmissive member 3 and moves between the light-shielding frame 5 and the light-transmissive member 3.

Even more specifically, as shown in FIG. 7C, a part of the second surface 3b of the light-transmissive member 3 is disposed so as to be located directly above the light-shielding frame 5, and as shown in FIG. 7D, the third surface 3e of the light-transmissive member 3 is brought into contact with the light reflecting resin 9a'. As shown in FIG. 7E, this contact causes the light reflecting resin 9a' to move from the flange 30 of the light-transmissive member 3 to the first side surface 5c side, and as shown in FIG. 7F, the light reflecting resin 9a' moves between the first side surface 3c of the light-transmissive member 3 and the inside surface 5c of the light-shielding frame 5.

In the optical member formation step, in the case where both the light-shielding frame 5 and the light-transmissive member 3 have a rectangular shape, a layout that is suited to a rectangular shape may be used. More specifically, in the case where the inner periphery of the first main surface 5a of the light-shielding frame 5 and the second surface 3b of the light-transmissive member 3 are both rectangular, having a long side and a short side, the light-transmissive member 3 and the light-shielding frame 5 may be disposed such that the distance (in plan view) between the long side of the second surface 3b and the long side of the inner periphery of the first main surface 5a is substantially equal to the distance between the short side of the second surface 3b and the short side of the inner periphery of the first main surface 5a.

Also, a collet or the like may be used for disposing the light-transmissive member 3 in the light-shielding frame 5 in the optical member formation step. For example, the light-transmissive member 3 may be disposed in the through-hole 50 of the light-shielding frame 5 in a state of being picked up by a suction means 70 such as a collet. After the light-transmissive member 3 has been disposed by this suction means, the light-transmissive member 3 can then be pressed to move the light reflecting resin 9a' that is in contact with the flange 30 of the light-transmissive member 3 to the desired region more quickly.

Before the optical member formation step, in the case where the flange 30 of the light-transmissive member 3 comes into contact with the light reflecting resin 9a' on the light-shielding frame 5, the third surface 3e of the light-transmissive member 3 will be in contact from the light reflecting resin 9a' on the convex portion 58 of the light-shielding frame 5, and then the third surface 3e will come into contact at another location of the light reflecting resin 9a' at a different time.

Optical Member Joining Step

Figure 8A:
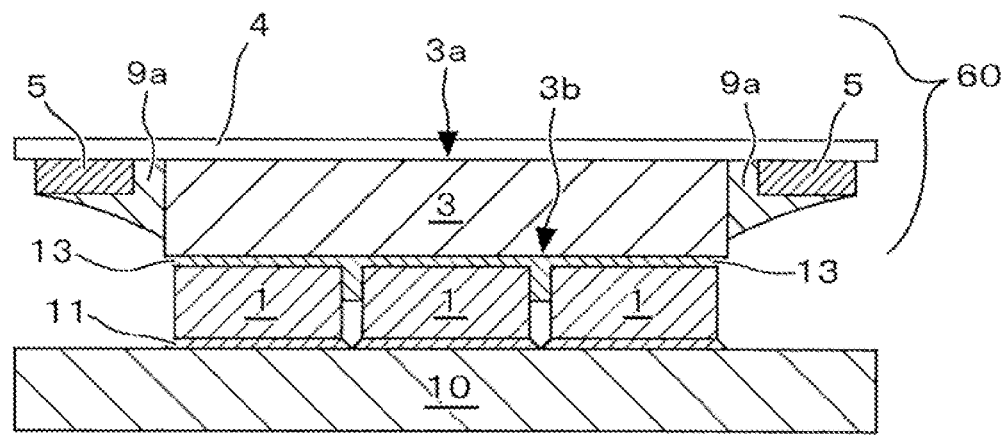
FIG. 8A is a schematic cross-sectional view showing an example of a manufacturing method according to an embodiment.

Here, as shown in FIG. 8A, the upper surface of the light emitting elements 1 placed on the substrate 10 and the second surface 3h of the light-transmissive member 3 are disposed opposite each other, and the optical member 60 is joined onto the light emitting elements 1.

That is, the second surface 3b of the light-transmissive member 3 in the optical member 60 is aligned with respect to the upper surface of the light emitting elements 1, and the light-transmissive member 3 is joined to the light emitting elements 1 by the light guide member 13, for example.

In the case where the light emitting device in the embodiment shown in FIGS. 1, 2A, and 2B is obtained, the optical member is aligned, for example, so that the outer periphery of the second surface 3b of the light-transmissive member 3 is located to the outside of the outer periphery of the light emitting elements 1 when viewed in plan view from above, and so that at least one side of the outer periphery, and preferably the entire outer periphery, of the first surface 3a of the light-transmissive member 3 is located to the inside of the outer periphery of the light emitting elements 1 when viewed in plan view from above.

In joining the second surface 3b of the light-transmissive member 3 of the optical member 60 and the upper surface of the light emitting elements 1, the light-transmissive member 3 that has been coated with an uncured resin that will serve as the light guide member 13 on the second surface 3h may be placed on the light emitting elements 1, or the light-transmissive member 3 of the optical member 60 may be placed on the light emitting elements 1 after the upper surface of the light emitting elements 1 has been coated with an uncured resin that will serve as the light guide member 13, The coating amount and viscosity of the resin that will serve as the light guide member 13, the load in the case where the light-transmissive member 3 is placed on the light emitting elements 1, and so forth may be appropriately set by taking into account the desired shape of the light guide member 13.

Second Light Reflecting Member Formation Step

Figure 8B:
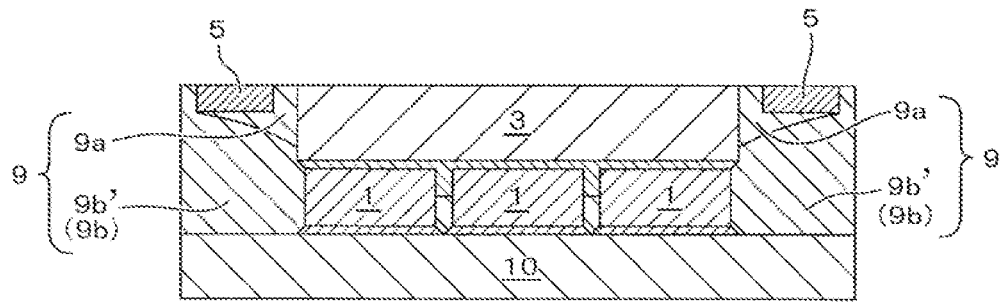
FIG. 8B is a schematic cross-sectional view showing an example of a manufacturing method according to an embodiment.

Here, the second light reflecting member 9b that covers the side surface of the light emitting elements 1 is formed between the first light reflecting member 9a and the substrate 10. More specifically, the uncured second light reflecting resin 9b' that will serve as the second light reflecting member 9b is disposed between the substrate 10 and the light-shielding frame 5. Consequently, as shown in FIG. 8B, a second light reflecting member 9b that surrounds the light emitting elements 1 and the light-transmissive member 3 can be formed between the substrate 10 and the light-shielding frame 5.

For example, in the case where a light-shielding frame 5 is used that is smaller than the substrate 10 (that is, in the case where the outer edge is small enough to be encompassed by the substrate 10 in plan view), the second light reflecting resin 9b' can be supplied into the space between the substrate 10 and the light-shielding frame 5 from the outside of the light-shielding frame 5. After the second light reflecting resin 9b' has thus been supplied between the substrate 10 and the light-shielding frame 5, the second light reflecting resin 9b' is cured to form the second light reflecting member 9b.

The light emitting device in this embodiment is manufactured as described above.

The above description has been made with reference to the drawings showing a single light emitting device. However, with the method for manufacturing a light emitting device in this embodiment, after a plurality of light emitting devices have been manufactured all at once using a substrate divided into a plurality of unit regions corresponding to individual light emitting devices, these individual light emitting devices may be separated.

More specifically, a plurality of light emitting devices can be produced as follows. (1) In the light emitting element disposing step, one or more light emitting elements are placed in each of a plurality of unit regions on a composite substrate. (2) In the optical member formation step, a plurality of optical members are formed in the plurality of unit regions. (3) In the optical member joining step, the optical members are joined so as to collectively cover the one or more light emitting elements placed in the above-mentioned the plurality of unit regions. (4) In the second light reflecting member formation step, the space between the composite substrate and the light-shielding frame in the optical member is filled with the second light reflecting resin. (5) After the second light reflecting member formation step, in the dividing step, the light reflecting member and the substrate are divided into unit regions to create individual light emitting devices. This division can be performed, for example, by cutting with a blade or the like.

Given that the division is made by unit region, it is preferable for the division position at dividing into unit areas to be apart from the outer periphery of the light-shielding frame. In other words, each light-shielding frame is preferably slightly smaller than the outer shape of the light emitting device. In this case, for example, the light-shielding frame may be a plurality of light-shielding frames that are slightly smaller than the outer shape of the light emitting device.

With the above method for manufacturing a light emitting device, since a plurality of light emitting devices are manufactured all at once and then separated into individual light emitting devices, a plurality of light emitting devices can be easily manufactured.

The convex portion of the light-shielding frame will now be described in detail. In an embodiment of the present disclosure, as shown in FIGS. 3A and 3B, the light-shielding frame 5 having the flat portion 55 and the convex portion 58 on the second main surface 5b is used. This light-shielding frame 5 can suppress the generation of voids during the manufacture of the light emitting device. More specifically, voids will be less likely to be included in the optical member in the case where a light-shielding frame 5 is used that has a convex portion 58 that is at least partially covered by the first light reflecting resin in the light reflecting resin supply step.

As described above, in an embodiment of the present disclosure, the convex portion 58 of the light-shielding frame 5 has the effect of promoting the movement of the light reflecting resin 9a' so as to suppress the generation of voids in the optical member formation step.

Figure 9A:
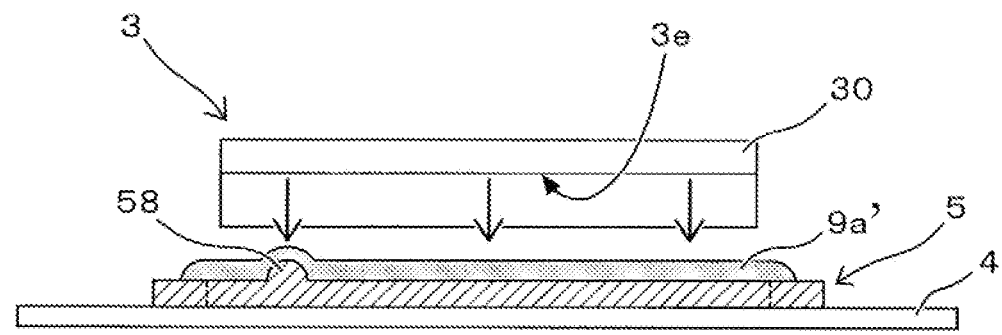
FIG. 9A is a schematic cross-sectional view illustrating the contact between a light-transmissive member and a light reflecting resin as an example of the manufacturing method according to an embodiment.
Figure 9B:
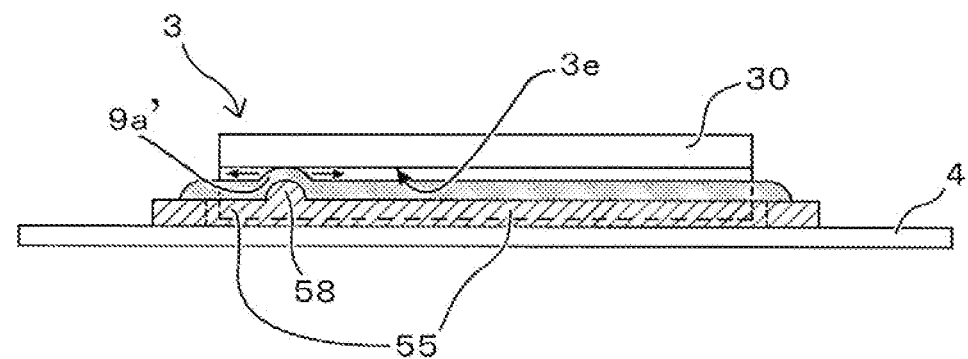
FIG. 9B is a schematic cross-sectional view illustrating the contact between a light-transmissive member and a light reflecting resin as an example of the manufacturing method according to an embodiment.
Figure 9C:
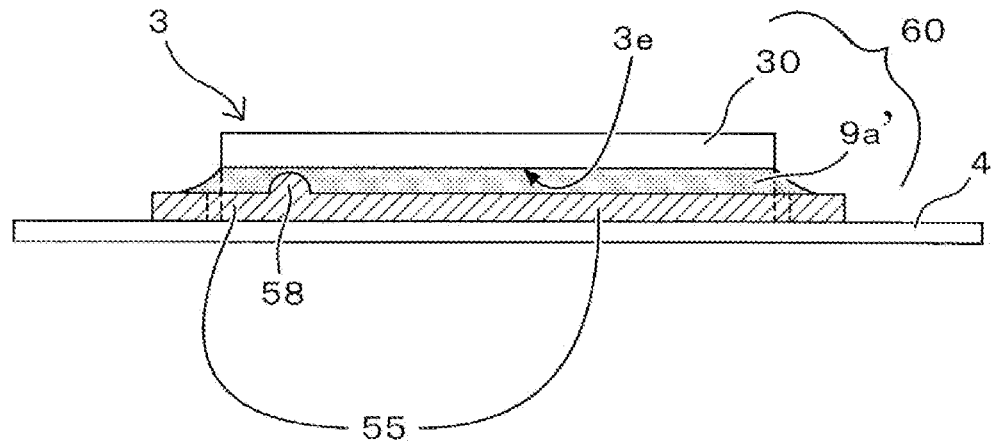
FIG. 9C is a schematic cross-sectional view illustrating the contact between a light-transmissive member and a light reflecting resin as an example of the manufacturing method according to an embodiment.

The contact between the light-transmissive member and the light reflecting resin at different times will be described in detail with reference to the schematic views of FIGS. 9A to 9C. As shown in FIGS. 9A to 9C, the optical member formation step includes a step of moving the light reflecting resin 9a' to the third surface 3e of the light-transmissive member 3 via the convex portion 58.

First, as shown in FIG. 9A, the light-transmissive member 3 is disposed with respect to the light-shielding frame 5 on which the light reflecting resin 9a' is disposed. The contact between the light reflecting resin 9a' and the light-transmissive member 3 is such that, as shown in FIG. 9B, the light reflecting resin 9a' on the convex portion 58 and the third surface 3e of the light-transmissive member 3 come into contact with each other first. This is because the light reflecting resin 9a' on the convex portion 58 forms the uppermost portion of the convex portion. In the case where the light reflecting resin 9a' and the third surface 3e of the light-transmissive member 3 come into contact with each other, the light reflecting resin 9a' on the convex portion 58 wets and spreads out over the third surface 3e of the light-transmissive member 3. That is, the light reflecting resin 9a' moves to the third surface 3e of the light-transmissive member 3 via the convex portion 58. This means that the movement of the light reflecting resin 9a' starts from the convex portion 58, so that the space between the flange 30 of the light-transmissive member 3 and the light-shielding frame 5 is filled with the light reflecting resin 9a'.

Next, as the light-transmissive member 3 descends further as shown in FIGS. 9B and 9C, the light reflecting resin 9a' on the flat portion 55 comes into contact with the third surface 3e of the light-transmissive member 3 in addition to the light reflecting resin 9a' on the convex portion 58. Consequently, the pressing action on the light reflecting resin 9a' by the light-transmissive member 3 increases. The result is that the space between the light-transmissive member 3 and the through-hole of the light-shielding frame 5 is filled in by the light reflecting resin 9a'' due to the pressing force on the light reflecting resin 9a' by the light-transmissive member 3 along with the wetting and spreading of the light reflecting resin 9a' to the third surface 3e starting at the convex portion 58. Finally, as shown in FIG. 9C, an optical member 60 is obtained in which the space between the flange 30 and the light-shielding frame 5 is filled by the light reflecting resin 9a' with substantially no gaps, and the light-shielding frame 5 and the light-transmissive member 3 are joined by the light reflecting resin 9a'.

As shown in FIGS. 3A and 3B, the light-shielding frame 5 has an inner periphery and an outer periphery having a substantially rectangular plan view shape, and the shape of the through-hole 50 is defined by the shape of the inner periphery (more precisely, the inside surface Sc). That is, as shown in FIG. 3B, the shape of the light-shielding frame 5 is substantially rectangular when viewed in plan view from above. The term "substantially rectangular" as used herein also includes shapes that are normally included in the concept of a rectangle as recognized by those skilled in the art. For instance, in addition to a rectangle having all straight sides, this also includes a rectangle in which at least a part of the sides is a curved line, and a rectangle having rounded corners.

In a certain mode, one or more convex portions are provided on the long side of the rectangle in the light-shielding frame that defines a through-hole that is substantially rectangular in plan view. That is, in a light-shielding frame in which the shape of the inner periphery when viewed from above in plan view is substantially rectangular, the convex portion may be disposed with respect to a second main surface including the long side of the inner periphery. In a light-shielding frame having a rectangular inner periphery, the part corresponding to the long side of the rectangle is where voids are particularly likely to occur. The reason for this is that the part corresponding to the long side is the part where the light-transmissive member and the light reflecting resin conic into contact with each other over a greater distance in the formation of the optical member, and is a region where it is difficult for air to escape to the outside in the case where the light reflecting resin moves "between the light-transmissive member and the light-shielding frame." In this regard, with the light-shielding frame used in the light emitting device according to this embodiment, the generation of voids can be more effectively suppressed by the convex portion provided on the long side where the air does not readily escape. In other words, the effect of suppressing the generation of voids tends to be more pronounced in the case where the convex portion is provided on the long side of the light-shielding frame.

In a light-shielding frame having a substantially rectangular frame shape in plan view, the convex portion provided on the long side of the rectangle may be disposed not near the center of the side, but near the end of the side. To use FIG. 3B as an example, in the light-shielding frame 5 having a substantially rectangular frame shape, the convex portion 58 provided on the long side 52 may be disposed in the end region 52N of the long side 52 rather than in the central region 52M. That is, in FIG. 3B, the convex portion 58 is provided in the end region 52N of the long side 52 of the light-shielding frame 5 having a substantially rectangular shape. In the case where the convex portion is thus disposed in the end region 52N of the light-shielding frame, the light reflecting resin on the end region will have the highest portion, so the light-transmissive member and the light reflecting member will gradually come into contact with each other from the end region in the course of the light-transmissive member and the light reflecting resin coming into contact in the optical member formation step. Consequently, air will easily escape from one of the long sides to the other, and it will be easy to obtain an optical member in which the generation of voids is further suppressed. Here, the end region refers to, for example, a region within 40% (more preferably 33%, 30% or 25%) of the length of the long side from the short side.

The convex portion 58 has a locally thick shape in the light-shielding frame 5. In cross-sectional view, the convex portion 58 is preferably wider on its lower side (base side) than on its upper side (distal end side). This is because suitable point contact between the light reflecting resin 9a' located on the convex portion 58 and the flange 30 of the light-transmissive member 3 is more likely to be brought about in the optical member formation step. That is, in the case where the light-transmissive member 3 and the light reflecting resin 9a' come into contact with each other in the optical member formation step, the light-reflective resin 9a' will more readily wet and spread out over the third surface 3e of the light-transmissive member 3, starting at the convex portion 58. Consequently, the time difference attributable to the height of the light reflecting resin 9a' produced in the optical member formation step can become more pronounced due to the point contact, and the generation of voids can be suppressed more effectively.

For example, it is preferable for the width of the convex portion 58 to decrease toward the top end of the convex portion 58. Examples of the specific cross-sectional shape of the convex portion 58 include semicircular, triangular, conical trapezoid, and so forth.

FIGS. 10A to 10D show a convex portion 58 having a semicircular shape, a triangular shape, and a trapezoidal shape in cross-sectional view.

As shown in the drawings, the convex portion 58 is wider on its lower side than on its upper side. More specifically, in the convex portion 58, in the case where Wa is the relatively upper dimension and Wb is the relatively lower dimension, then Wa<Wb. Also, in the semicircular convex portion 58, the width gradually decreases toward the top end thereof. With a convex portion having such a shape, the contact between the flange of the light-transmissive member and the light reflecting resin on the convex portion will tend to be point contact in the optical member formation step.

Figure 10A:
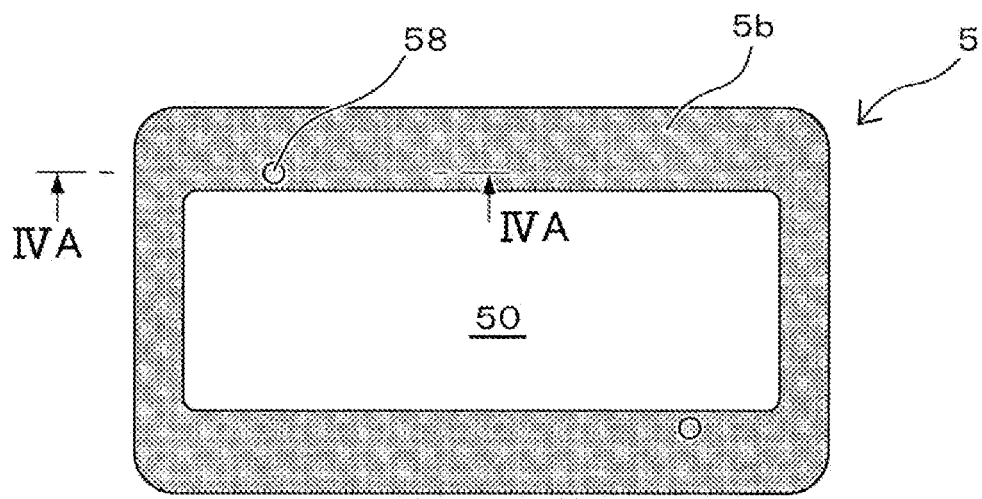
FIG. 10A is a schematic plan view illustrating an example of the form of convex portion.
Figure 10B:
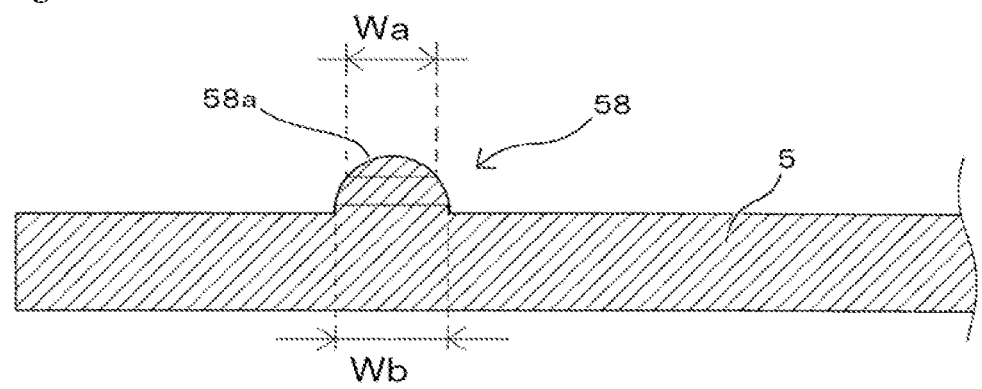
FIG. 10B is a schematic cross-sectional view taken along the IVA-IVA line in FIG. 10A.
Figure 10C:
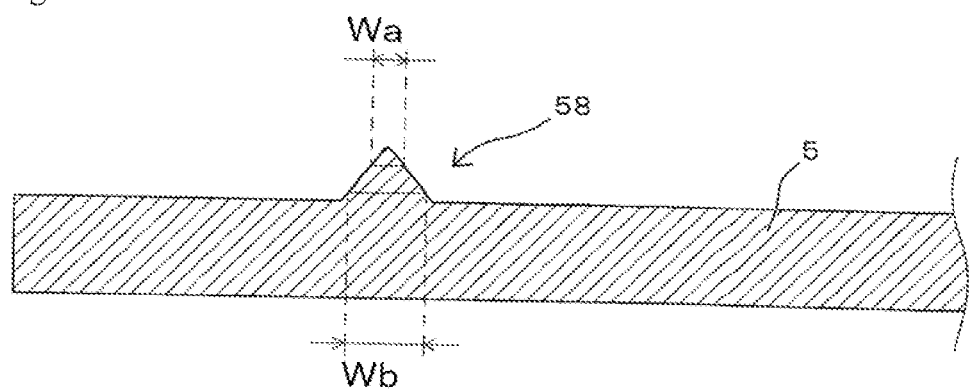
FIG. 10C is a schematic cross-sectional view taken along the IVA-IVA line in FIG. 10A.
Figure 10D:
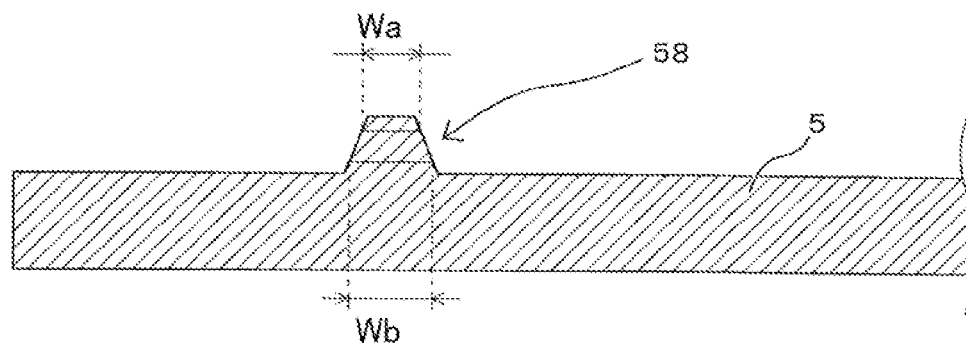
FIG. 10D is a schematic cross-sectional view taken along the IVA-IVA line in FIG. 10A.

As shown in FIG. 10A, it is preferable for the convex portion 58 to be provided more to the inner peripheral side of the second main surface 5b of the light-shielding frame 5. That is, in the width direction of the light-shielding frame 5 (that is, the direction toward the outer periphery at the position closest to the inner periphery), the convex portion 58 is preferably provided relatively inward, that is, closer to the through-hole 50 side. Consequently, in the case where the light-transmissive member 3 is disposed with respect to the light-shielding frame 5 in the optical member formation step, the convex portion 58 of the light-shielding frame 5 and the flange 30 of the light-transmissive member 3 will tend to be opposite each other. For example, the light-shielding frame 5 may be provided with the convex portion 58 in a region that is more to the inside than the middle in the width direction.

In an embodiment of the present disclosure, there are no particular restrictions on the plan view size of the convex portion in the width direction of the light-shielding frame 5. That is, there are no particular restrictions on the maximum size of the convex portion, which is wider on the lower side than the upper side, in the width direction of the light-shielding frame. However, in the optical member, it is preferable for the uppermost part of the convex portion to be disposed so as to overlap the flange of the light-transmissive member.

In an embodiment according to the present disclosure, the convex portion has a height suitable for contact between the light reflecting resin supplied on the convex portion and the flange of the light-transmissive member. For example, the maximum height of the convex portion 58, using the flat portion of the second main surface as a reference, is preferably greater than the thickness of the light reflecting resin formed on the flat portion 55 in the light reflecting resin supply step. For example, the maximum height of the convex portion 58 may be greater than 20 μm, for example. On the other hand, in the case where the maximum height of the convex portion is too great, it may hamper the disposition of the light-transmissive member in the optical member formation step. That is, in the case where the light-transmissive member is disposed on the light-shielding frame in the optical member formation step, there is a risk that the flange of the light-transmissive member will hit the convex portion of the light-shielding frame, and that the light-transmissive member will be damaged. It is therefore preferable for the convex portion to have a height that will avoid impact with the flange of the light-transmissive member in the optical member formation step.

Figure 11:
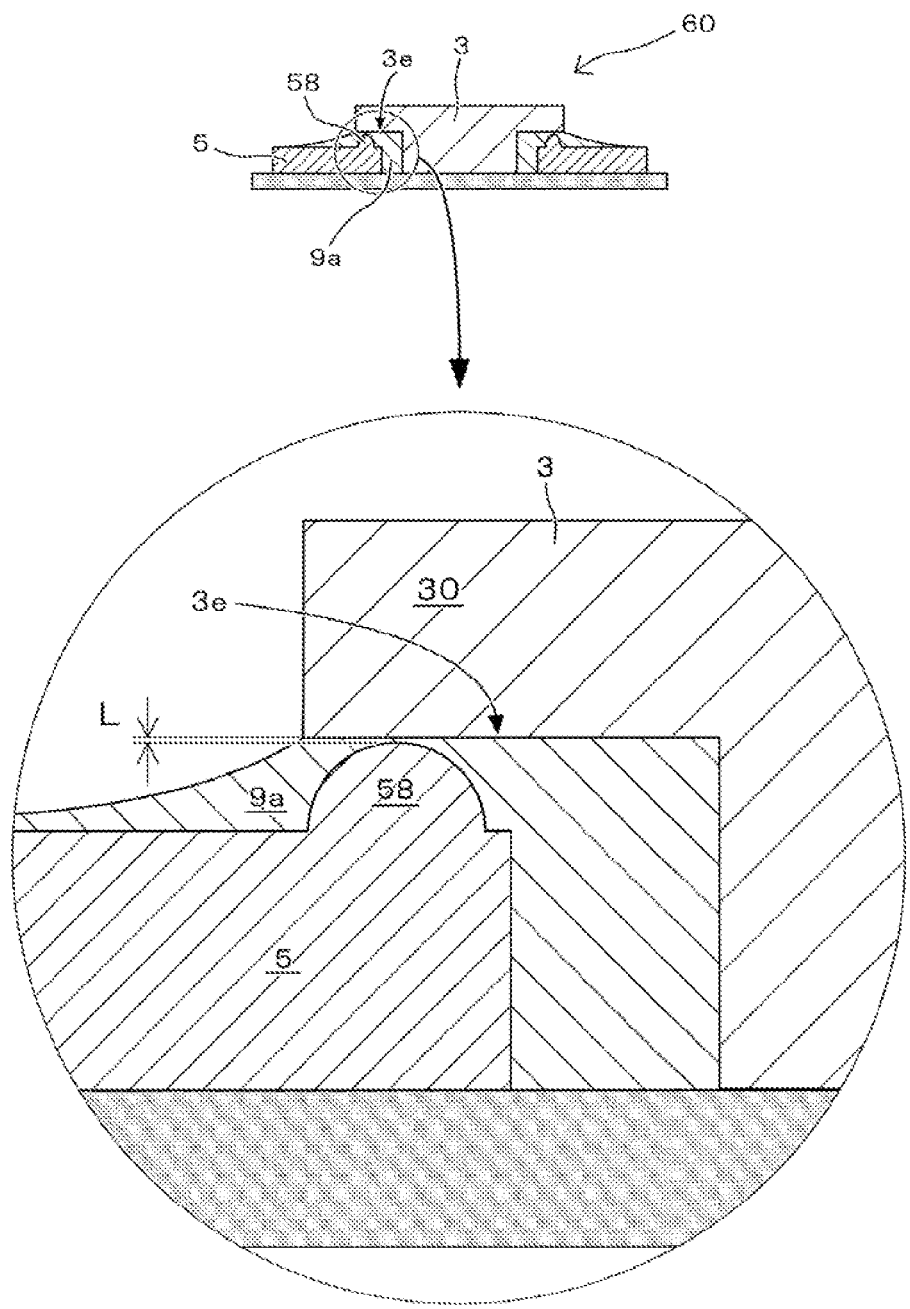
FIG. 11 is a schematic cross-sectional view of an optical member, illustrating a certain mode of the manufacturing method according to an embodiment.

In this regard, the optical member formation step preferably includes a step of forming an optical member in which the third surface of the light-transmissive member and the convex portion are separated from each other via the light reflecting member. As shown in FIG. 11, with the optical member 60, a gap L is provided between the third surface 3e of the light-transmissive member 3 and the convex portion 58 (the tallest portion) of the light-shielding frame 5, and the first light reflecting member 9a may be interposed in this gap L. In the case where the gap L is too large, the contact between the light reflecting resin on the convex portion and the flange of the light-transmissive member is will be less likely to be point contact, so the gap L is preferably as small as possible. An example would be 0<L<15 μm.

The method for manufacturing a light emitting device according to an embodiment can be embodied by various modes.

Mode of Layout of Convex Portions

Figure 12A:
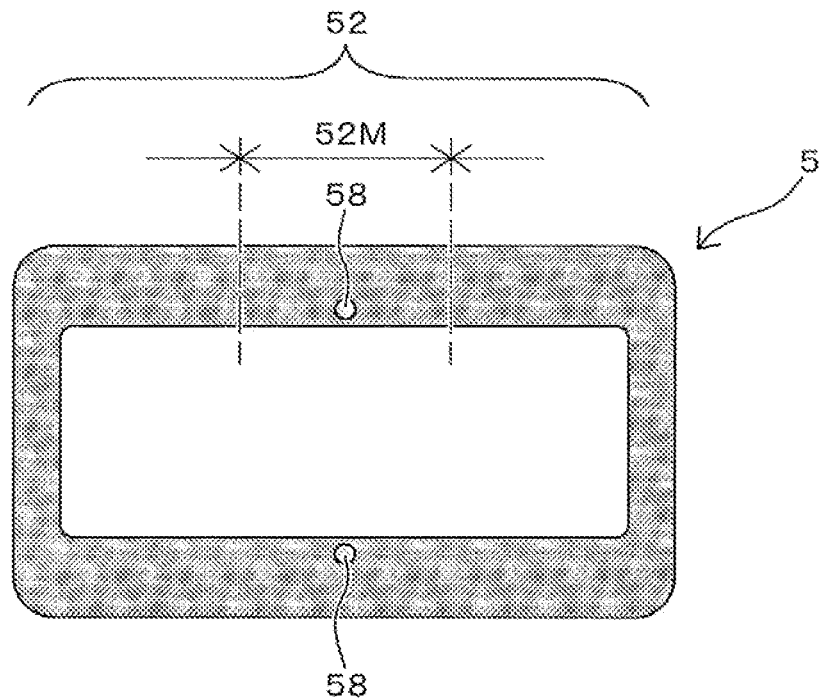
FIG. 12A is a schematic plan view showing another example of a light-shielding frame of a light emitting device according to an embodiment.

Various modes are conceivable for the layout of the convex portions. For example, as shown in FIG. 12A, the convex portions 58 may be disposed near the center of the frame. That is, the convex portions may be disposed near the center in the region corresponding to one of the sides constituting the light-shielding frame 5. In the plan view shown in FIG. 12A, the convex portions 58 may be disposed in the central region 52M of the long side 52 of the light-shielding frame 5, which has a substantially rectangular frame shape. In this case, the light reflecting resin on the central region of the light-shielding frame forms the uppermost part, in the case where the light-transmissive member and the light reflecting resin come into contact with each other in the optical member formation step, the light-transmissive member and the light reflecting resin can be gradually brought into contact with each other from the central region toward the two sides flanking this central region. Consequently, air can easily escape from the central portion with little bias in the opposite directions, and the generation of voids is better suppressed.

In an embodiment of the present disclosure, the number of convex portions provided to the light-shielding frame is not limited to one, and may be two or more. For example, as shown in FIG. 12B, a plurality of convex portions 58 may be provided in a region corresponding to one side of the light-shielding frame.

Figure 12B:
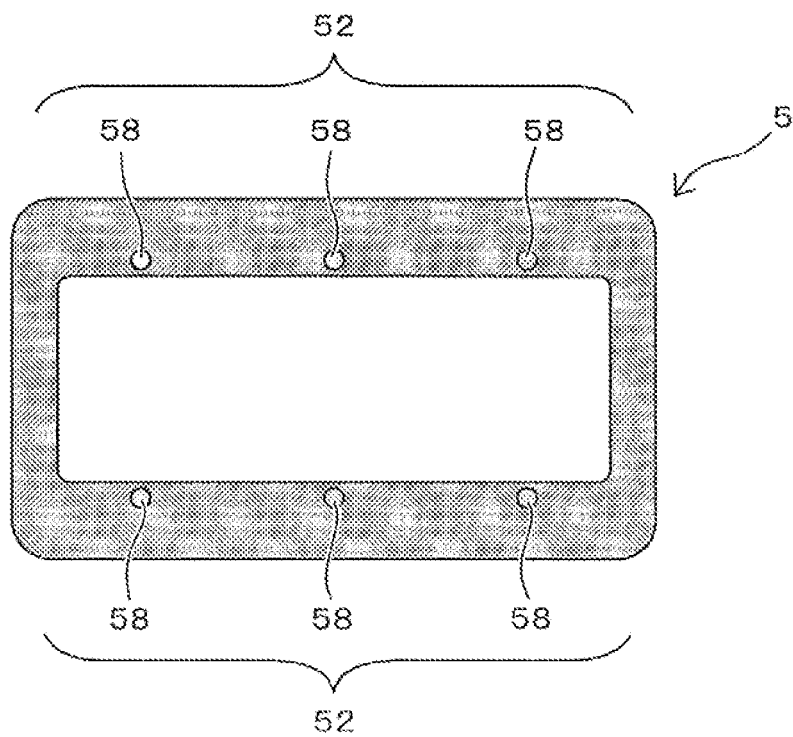
FIG. 12B is a schematic plan view showing another example of a light-shielding frame of a light emitting device according to an embodiment.

With the light-shielding frame 5 having a substantially rectangular frame shape shown in FIG. 12B, three convex portions 58 are provided on each long side 52 thereof. In the case where a plurality of convex portions 58 are thus provided, the disposition state of the light-shielding frame is less likely to have an effect, and a more favorable optical member formation step can be carried out.

Figure 13:
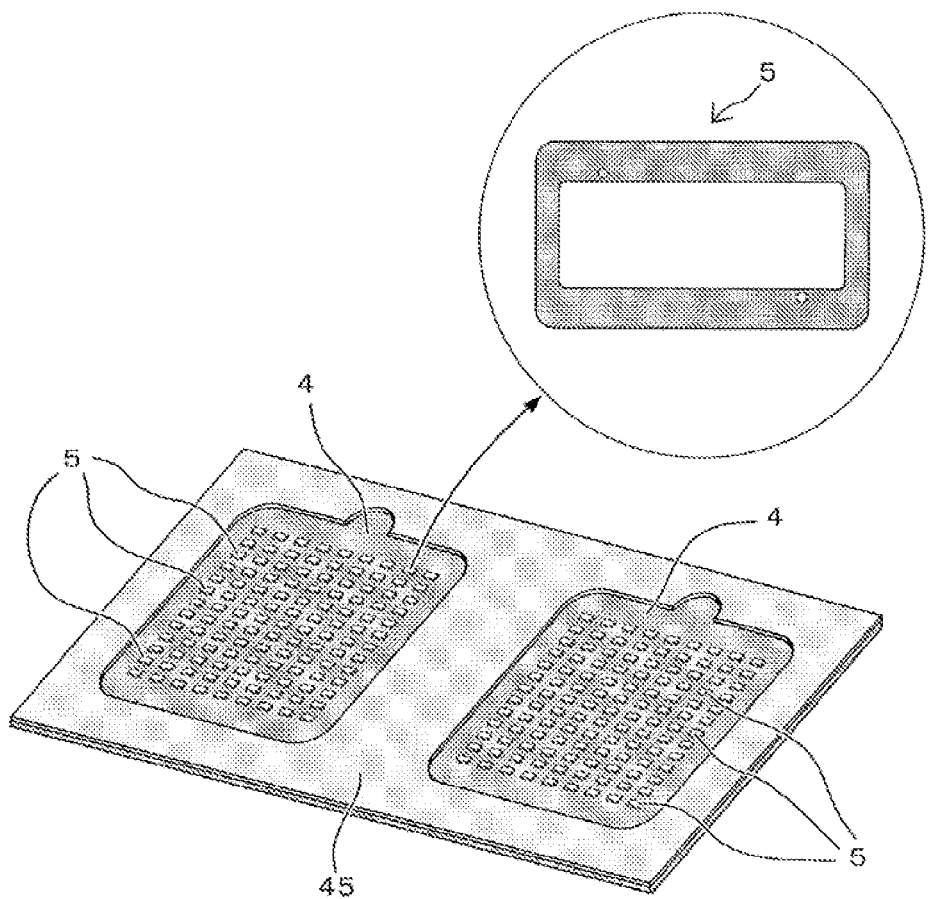
FIG. 13 is a schematic oblique view and a partial plan view showing an example of a mode in which a light-shielding frame is disposed on a sheet.

More specifically, in the case where the upper surface of the light-shielding frame ends up being tilted because the sheet fixing the light-shielding frame is bent (or warp) or for some other reason, the surface of the light reflecting resin supplied to the light-shielding frame will also end up being tilted overall. For example, assuming that a resin sheet 4 is affixed to a rigid frame body 45 for fixing a sheet, and a plurality of light-shielding frames 5 are fixed to this resin sheet 4, as shown in FIG. 13, it may be impossible to keep the upper surfaces of the various light-shielding frames strictly horizontal. This is because the resin sheet 4 affixed to the rigid frame body 45 may have a microscopically flexible surface even though it has a macroscopically inflexible surface. In such a case, there may be a place where the separation distance between the light-transmissive member and the light reflecting resin disposed in the optical member formation step is larger than expected, and at that place there is the risk that the light-transmissive member and the light reflecting resin will not be in sufficient contact. Since the location where this separation distance becomes larger depends on the sheet bending, it is difficult to predict where it will occur. In this regard, in the case where a plurality of convex portions are provided to the light-shielding frame, one of these convex portions will be positioned at the place where the separation distance becomes larger, and as a result, the light-transmissive member and the light reflecting resin can easily be brought into contact with each other in the optical member formation step.

In the case where a plurality of light-shielding frames 5 are fixed to the sheet 4 as shown in FIG. 13, a plurality of convex portions may be disposed symmetrically in plan view in each of the light-shielding frames 5 so that the variance in the inclination of the light-shielding frames 5 is suppressed among the plurality of light-shielding frames 5. With the light-shielding frame 5 shown in FIGS. 12A and 12B, a plurality of convex portions 58 are disposed in point symmetry or line symmetry in plan view. Similarly, with the light-shielding frame 5 shown in FIG. 3B, two convex portions 58 are disposed so as to be in point symmetry with respect to the center of the light-shielding frame in plan view. In other words, with the light-shielding frame 5 shown in FIG. 3B, the convex portions 58 are disposed so as to be located diagonally from each other.

Mode of Separately-Formed Convex Portions

Figure 14A:
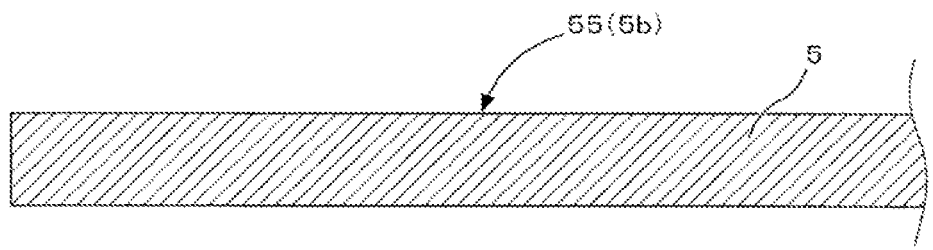
FIG. 14A is a schematic cross-sectional view showing an example of a step of forming convex portion.
Figure 14B:
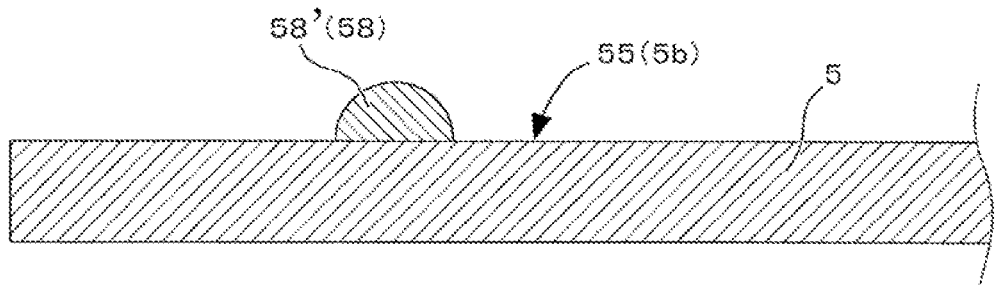
FIG. 14B is a schematic cross-sectional view showing an example of a step of forming convex portion.
Figure 15A:
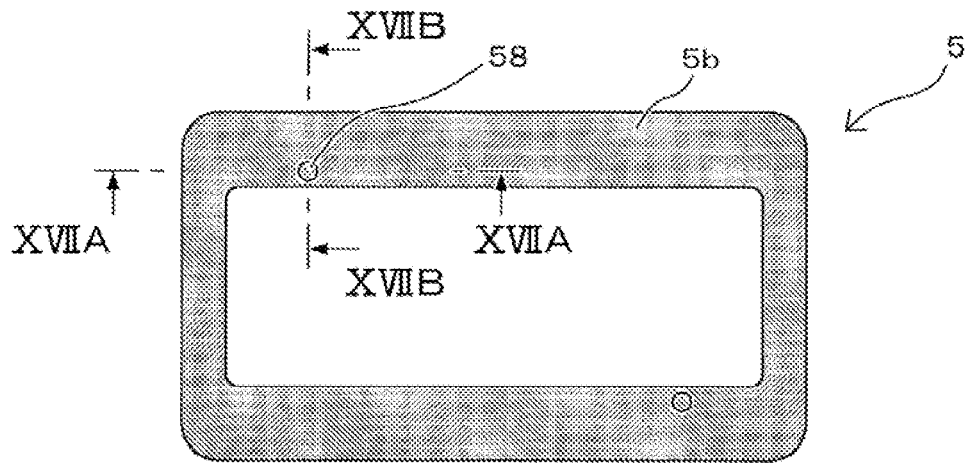
FIG. 15A is a schematic plan view illustrating an example of the form of convex portion.
Figure 15B:
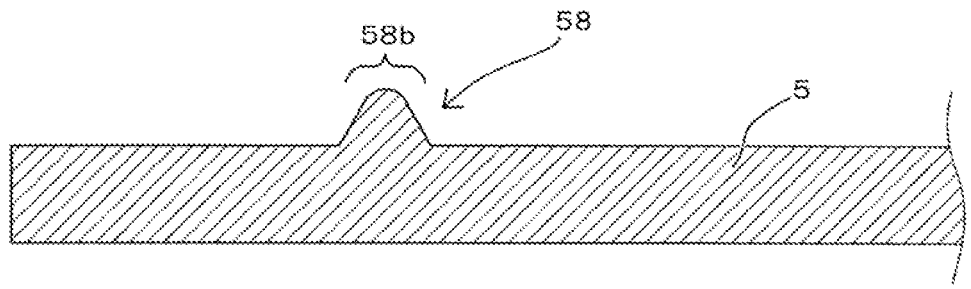
FIG. 15B is a schematic cross-sectional view taken along the XVIIA-XVIIA line in FIG. 15A.
Figure 15C:
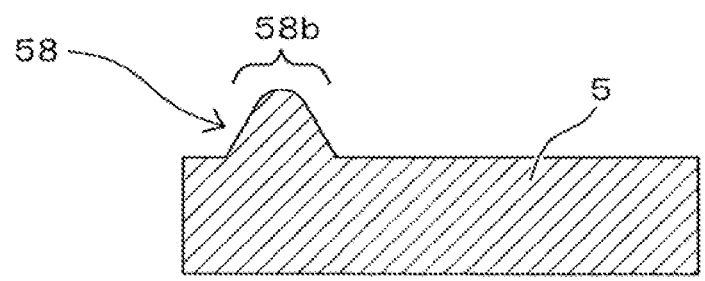
FIG. 15C is a schematic cross-sectional view taken along the XVIIB-XVIIB line in FIG. 15A.
Figure 16A:
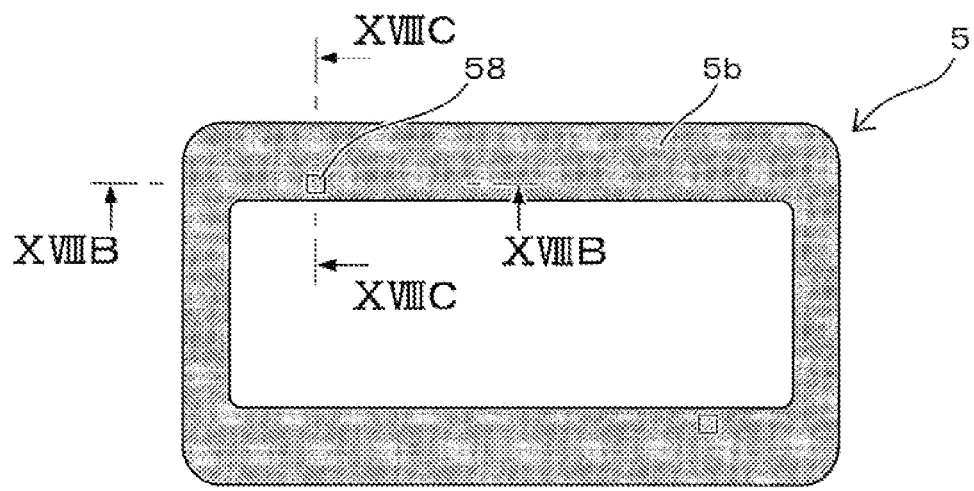
FIG. 16A is a schematic plan view illustrating an example of the form of convex portion.
Figure 16B:
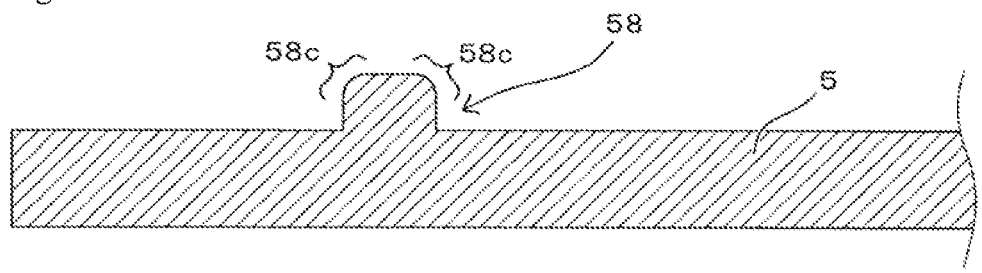
FIG. 16B is a schematic cross-sectional view taken along the XVIIIB-XVIIIB line in FIG. 16A.
Figure 16C:
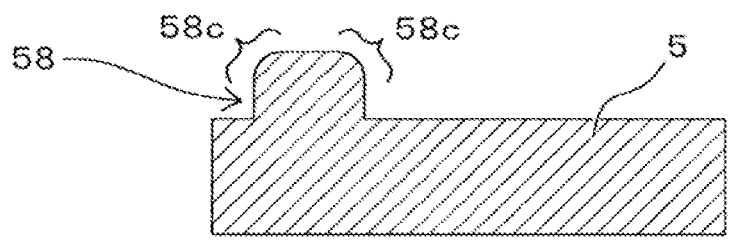
FIG. 16C is a schematic cross-sectional view taken along the XVIIIC-XVIIIC line in FIG. 16A.

In an embodiment according to the present disclosure, the convex portions may be provided to the light-shielding frame in advance, or as shown in FIGS. 14A and 14B, a convex portion 58' may be formed on the flat portion 55 of the light-shielding frame 5, or a pre-molded convex portion 58' may be disposed on the flat portion 55.

That is, the light-shielding frame preparation step may include a step of forming a convex portion 58' on the second main surface 5b of the light-shielding frame 5. The convex portion 58' can be made of any material so long as the convex portion 58' can be provided on the second main surface 5b of the light-shielding frame 5, and for example, a material such as resin, a ceramic and/or a metal may be supplied to the second main surface 5b to form the convex portion 58'.

The material of the convex portion 58' may be the same as or different from that of the light-shielding frame 5. For example, the convex portion 58' may be formed so that the material of the convex portion 58' is different from the material of the other portion of the light-shielding frame 5 (such as the flat portion 55).

In a preferred embodiment, a resin having a viscosity higher than that of the light reflecting resin 9a' may be used as the material of the convex portion 58'. This is because the convex portion 58' will be less likely to undergo a shape change on the light-shielding frame 5, and the convex portion 58' can be maintained in a more favorable shape. For example, the convex portion 58' may be formed by supplying to the second main surface 5b a resin that has the same baste material as the light reflecting resin 9a' and that has been adjusted to a higher viscosity. This is merely an example, but in the case where a silicone resin is used as the light reflecting resin 9a', a silicone resin may also be used as the material of the convex portion 58'. In this case, the convex portion 58' may be formed from a silicone resin having a relatively high viscosity by adjusting the amount of filler or the like.

Thus, a mode in which the convex portions 58' are formed on the light-shielding frame has an advantage in that it affords a greater degree of latitude in design in terms of the characteristics, layout, shape, and the like of the convex portions 58' in the light-shielding frame 5.

Mode of Convex Portions with Curved Surface

In cross-sectional view, the upper surface (distal end surface) of the convex portion preferably includes a curved surface. As shown in FIGS. 10A to 10D mentioned above, or as shown in FIGS. 15A to 15C and 16A to 16C, the upper surface of the convex portions 58 is preferably not angular. Furthermore, the surface of the convex portions 58 preferably does not include a pointed region. This makes it less likely that the light reflecting resin will be interrupted at the convex portions 58 in the optical member formation step. More specifically, in the optical member formation step, in the case where the light reflecting resin 9a' on the convex portions 58 comes into contact with the flange 30 of the light-transmissive member 3, it will be less likely that the light reflecting resin 9a' is interrupted and is hindered from wetting and spreading out over the third surface 3e of the light-transmissive member 3. Also, it is preferable for the upper surface of the convex portion to include a curved surface in terms of preventing damage to the light-transmissive member. More specifically, in the case where the upper surface of the convex portion 58 is angular, then the light-transmissive member may come into contact with the convex portions of the light-shielding frame in the case where the light-transmissive member is being disposed in the optical member formation step, there is a risk that the light-transmissive member will be damaged, but impact during contact, etc., can be mitigated by giving the upper surface of the convex portions a curved surface.

Embodiments of the present disclosure have been described above, but these are merely typical examples. Therefore, a person skilled in the art will readily understand that the present invention is not limited to these, and that various modes are conceivable.

For example, a mode has been described above in which, in the light reflecting resin supply step, the convex portions have been completely covered by the light-reflective resin, but the present disclosure is not necessarily limited to this. For instance, another mode is conceivable in which the convex portions are only partially covered by the first light reflecting resin, and the tops of the convex portions are not covered by the light reflecting resin. In this mode, in the case where the convex portions are taller (such as in the case where the maximum height of the convex portions is the same as the separation distance between the flat portion of the second main surface of the light-shielding frame and the third surface of the light-transmissive member in the optical member), the flange of the light-transmissive member disposed on the light-shielding frame will first come into contact with the convex portions in the optical member formation step. That is, the third surface of the light-transmissive member will first come into contact with the convex portions of the light-shielding frame, and this will be accompanied by movement of the first light reflecting resin partially covering the convex portions to the third surface. Even in this mode, there is a time difference attributable to the convex portions, that is, a time difference in the contact between the light-transmissive member and the light reflecting resin, and an optical member in which the generation of voids is further suppressed can be obtained.

Also, it has been described above that the width of the rectangular light-shielding frame is constant in the portion corresponding to one side of the rectangle, but the width of the light-shielding frame may be constant in one side, or may vary from one place to the next. For example, the light-shielding frame may have a narrow portion that is partially narrowed. That is, a light-shielding frame having a substantially rectangular shape in plan view may be provided with a narrow region that is partially narrower on the long side of the rectangle, and a wide region that is wider than that. With a light-shielding frame thus having such a narrow region and a wide region, the height of the supplied light reflecting resin can be more favorably adjusted in the light reflecting resin supply step. In the case where the uncured light reflecting resin is supplied to the light-shielding frame having a narrow region and a wide region, the light reflecting resin wets and spreads out over the light-shielding frame. The wetting and spreading of the resin over the light-shielding frame is such that the light reflecting resin spreads out more widely in the wide region because it is wider, while the light reflecting resin spreads out less widely in the narrow region because it is narrower. Consequently, in the wide region, which is the wider region, the height of the light reflecting resin is lower, while the light reflecting resin located in the narrow region tends to be taller. Thus, it is possible to form a height difference with respect to the light reflecting resin on the light-shielding frame portion not only from the effect of the convex portion, but also from the effect of the narrow and wide regions.

Furthermore, although the light reflecting resin supply step has been described above, with the present disclosure it is not always necessary to supply the light reflecting resin to all the sides of the light-shielding frame. For instance, in the case where the light-shielding frame has a substantially rectangular frame shape in plan view, the light reflecting resin may be supplied only to the portion corresponding to the long side on the second main surface 5b. In this case, in the case where the light reflecting resin is supplied to the light-shielding frame and/or the light reflecting resin on the light-shielding frame is pressed by the flange of the light-transmissive member, causing the light reflecting resin to flow into the "space between the light-transmissive member and the light-shielding frame," the light reflecting resin on the "long side" flows so as to come around to the "short side" side. That is, the light reflecting resin on the long side of the frame portion flows so as to conic around to the "short side" side of the frame portion while filling the "space between the light-transmissive member and the through-hole of the light-shielding frame."

In the above, the flange 30 is provided only to one set of opposing sides of the light-transmissive member 3 (in particular, the long side of the substantially rectangular light-transmissive member) in plan view (for example, see FIGS. 4A and 4B), but the present invention is not limited to this. In the light-transmissive member, the flange may also be provided to two sets of opposing sides. That is, with a substantially rectangular light-transmissive member, the flange may be provided not only on the opposing long sides, but also on the opposing short sides.

What is claimed is:

1. A method for manufacturing a light emitting device, comprising:

disposing light emitting elements on a substrate;
preparing a light-shielding frame having a first main surface and a second main surface on an opposite side from the first main surface, the light-shielding frame defining a through-hole extending between the first main surface and the second main surface, and the light-shielding frame having at least one convex portion on the second main surface;
supplying a light reflecting resin to the second main surface of the light-shielding frame so that the light reflecting resin comes into contact with the convex portion and the convex portion is at least partially covered by the light reflecting resin;
preparing a light-transmissive member having
- a first surface with an outer periphery that is smaller than an inner periphery of the first main surface of the light-shielding frame surrounding the through-hole in a plan view,
- a second surface on an opposite side from the first surface,
- a first side surface contiguous with the first surface,
- a second side surface located outside of the first side surface in the plan view, the second side surface being contiguous with the second surface, and
- a third surface contiguous with the first side surface and the second side surface;

bringing the third surface of the light-transmissive member into contact with the convex portion of the light-shielding frame, or with the light reflecting resin that is in contact with the convex portion, while the first side surface of the light-transmissive member and an inside surface of the light-shielding frame are separated from each other, so that the light reflecting resin is disposed between the first side surface of the light-transmissive member and the inside surface of the light-shielding frame;
curing the light reflecting resin to form a first light reflecting member thereby forming an optical member in which the light-shielding frame and the light-transmissive member are joined by the first light reflecting member; and
joining upper surfaces of the light emitting elements and the second surface of the light-transmissive member.

2. The method for manufacturing a light emitting device according to claim 1, wherein
the supplying of the light reflecting resin includes supplying the light reflecting resin such that a highest position of the light reflecting resin disposed on the second main surface is located on the convex portion.

3. The method for manufacturing a light emitting device according to claim 1, wherein
the bringing of the third surface of the light-transmissive member into contact with the convex portion, or with the light reflecting resin that is in contact with the convex portion includes moving the light reflecting resin to the third surface of the light-transmissive member via the convex portion.

4. The method for manufacturing a light emitting device according to claim 1, wherein
the preparing of the light-shielding frame includes preparing the light-shielding frame so that the convex portion is wider on a base side than on a distal end side in a cross-sectional view.

5. The method for manufacturing a light emitting device according to claim 1, wherein
the preparing of the light-shielding frame includes preparing the light-shielding frame so that a distal end surface of the convex portion includes a curved surface in a cross-sectional view.

6. The method for manufacturing a light emitting device according to claim 1, wherein
the preparing of the light-shielding frame includes preparing the light-shielding frame so that a shape of the inner periphery of the light-shielding frame when viewed from above has a substantially rectangular shape, and the convex portion is disposed on the second main surface located on a long side of the substantially rectangular shape.

7. The method for manufacturing a light emitting device according to claim 1, wherein
the preparing of the light-shielding frame includes forming the convex portion on a flat portion of the second main surface of the light-shielding frame.

8. The method for manufacturing a light emitting device according to claim 1, wherein
the forming of the optical member includes forming the optical member in which the third surface of the light-transmissive member and the convex portion are separated from each other via the light reflecting member.

9. The method for manufacturing a light emitting device according to claim 1, wherein
the preparing of the light-shielding frame includes preparing the light-shielding having a plurality of convex portions including the at least one convex portion on the second main surface, the plurality of convex portions being disposed so as to be in point symmetry with respect to a center of the light-shielding frame in a plan view.

10. The method for manufacturing a light emitting device according to claim 1, wherein
the preparing of the light-shielding frame includes preparing the light-shielding frame having the at least one convex portion that is positioned closer to the through-hole than to an outer periphery of the light-shielding frame.

11. The method for manufacturing a light emitting device according to claim 1, wherein
the forming of the optical member includes forming the optical member in which the first surface of the light-transmissive member and the first main surface of the light-shielding frame are flush with each other.

12. The method for manufacturing a light emitting device according to claim 1, further comprising
after the joining of the upper surfaces of the light emitting elements and the second surface of the light-transmissive member, supplying an additional light reflecting resin in a space between the substrate and the light-shielding frame, and curing the additional light reflecting resin to form a second light reflecting member.

* * * * *